United States Patent
Kaga

(10) Patent No.: US 10,622,213 B2
(45) Date of Patent: Apr. 14, 2020

(54) METHOD OF MANUFACTURING SEMICONDUCTOR DEVICE

(71) Applicant: HITACHI KOKUSAI ELECTRIC INC., Tokyo (JP)

(72) Inventor: Yukinao Kaga, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/623,887

(22) Filed: Jun. 15, 2017

(65) Prior Publication Data
US 2017/0287716 A1   Oct. 5, 2017

Related U.S. Application Data

(63) Continuation of application No. PCT/JP2014/083283, filed on Dec. 16, 2014.

(51) Int. Cl.
*H01L 21/285* (2006.01)
*H01L 21/31* (2006.01)
(Continued)

(52) U.S. Cl.
CPC ........ *H01L 21/285* (2013.01); *C23C 16/4584* (2013.01); *C23C 16/45527* (2013.01); *C23C 16/45546* (2013.01); *C23C 16/45563* (2013.01); *C23C 16/45578* (2013.01); *H01L 21/28562* (2013.01); *H01L 21/3065* (2013.01); *H01L 21/31* (2013.01); *H01L 21/32051* (2013.01); *H01L 21/67383* (2013.01)

(58) Field of Classification Search
CPC .............. H01L 21/285; H01L 21/3065; H01L 21/67383; C23C 16/45563; C23C 16/4584
See application file for complete search history.

(56) References Cited

U.S. PATENT DOCUMENTS

2007/0252299 A1* 11/2007 Mahajani .......... C23C 16/45546
                                                        264/81
2010/0136260 A1    6/2010 Matsunaga et al.
(Continued)

FOREIGN PATENT DOCUMENTS

JP    2010-090413 A    4/2010
JP    2011-052319 A    3/2011
(Continued)

OTHER PUBLICATIONS

International Search Report, PCT/JP2014/083283, dated Mar. 31, 2015, 1 pg.
(Continued)

*Primary Examiner* — Duy Vu N Deo
(74) *Attorney, Agent, or Firm* — Volpe and Koenig, P.C.

(57) ABSTRACT

A method of manufacturing a semiconductor device, includes rotating a substrate support tool accommodated in a process chamber and configured to support a substrate with a rail, and supplying a process gas including a first gas to the substrate from a first gas supply hole positioned at an outer side of the substrate in a horizontal direction while rotating the substrate support tool. In the act of supplying the process gas, the first gas is supplied to the substrate in a first period in which the rail is not positioned between the first gas supply hole and the substrate in the horizontal direction.

8 Claims, 20 Drawing Sheets

(51) Int. Cl.
*C23C 16/455* (2006.01)
*H01L 21/3205* (2006.01)
*C23C 16/458* (2006.01)
*H01L 21/3065* (2006.01)
*H01L 21/673* (2006.01)

(56) References Cited

U.S. PATENT DOCUMENTS

| | | |
|---|---|---|
| 2012/0315394 A1 | 12/2012 | Ito |
| 2015/0262816 A1 | 9/2015 | Saito et al. |
| 2015/0325484 A1* | 11/2015 | Lin .................... H01L 21/3215 |
| | | 257/753 |

FOREIGN PATENT DOCUMENTS

| | | |
|---|---|---|
| JP | 2011-216844 A | 10/2011 |
| JP | 2012-195422 A | 10/2012 |

OTHER PUBLICATIONS

Japanese Office Action dated Feb. 7, 2018 for the Japanese Patent Application No. 2016-564493.
Japanese Office Action dated May 29, 2019 for the Japanese Patent Application No. 2018-180012.

* cited by examiner

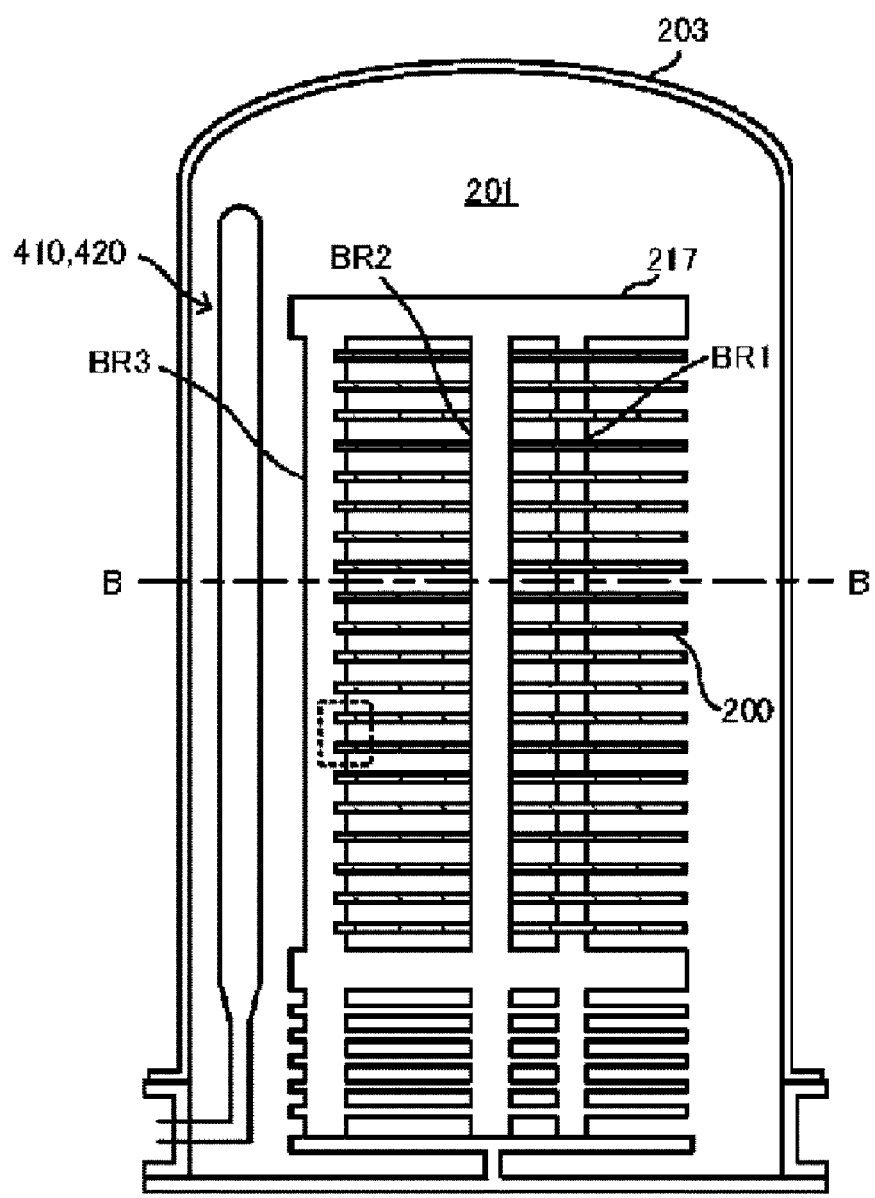

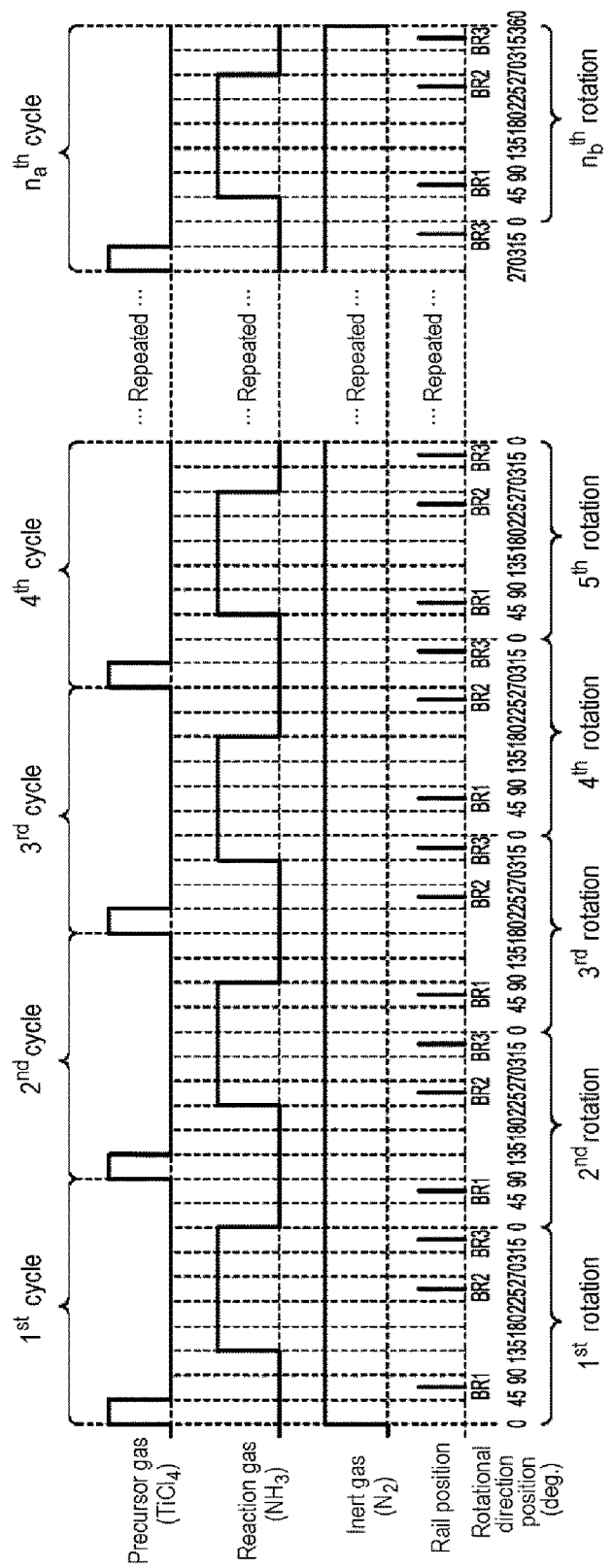

METHOD OF MANUFACTURING SEMICONDUCTOR DEVICE

CROSS-REFERENCE TO RELATED APPLICATION

This application is a bypass continuation application of international application No. PCT/JP2014/083283 having an international filing date of Dec. 16, 2014 and designating the United States, the entire contents of which are incorporated herein by reference.

TECHNICAL FIELD

The present disclosure relates to a method of manufacturing a semiconductor device.

BACKGROUND

As one of manufacturing processes of a semiconductor device, a substrate processing process, for example, a film forming process, an etching process or the like performed by supplying a process gas to a substrate in a process chamber, may be performed in some cases.

In a substrate processing process performed by supplying a process gas to a substrate in a process chamber, for example, it may be desirable to increase the in-plane processing uniformity and the like.

SUMMARY

Some embodiments of the present disclosure provide a novel technique applicable to a substrate processing process performed by supplying a process gas to a substrate in a process chamber.

According to one embodiment of the present disclosure, there is provided a method of manufacturing a semiconductor device, including rotating a substrate support tool accommodated in a process chamber and configured to support a substrate with a rail, and supplying a process gas including a first gas to the substrate from a first gas supply hole positioned at an outer side of the substrate in a horizontal direction while rotating the substrate support tool. In the act of supplying the process gas, the first gas is supplied to the substrate in a first period in which the rail is not positioned between the first gas supply hole and the substrate in the horizontal direction.

BRIEF DESCRIPTION OF DRAWINGS

FIG. 4A is a schematic side view showing an example of a boat which supports wafers.

FIG. 5B is a timing chart showing the relationship between a process gas supply timing and a rotational direction position in a film forming process of a first embodiment.

DETAILED DESCRIPTION

Figure 1:
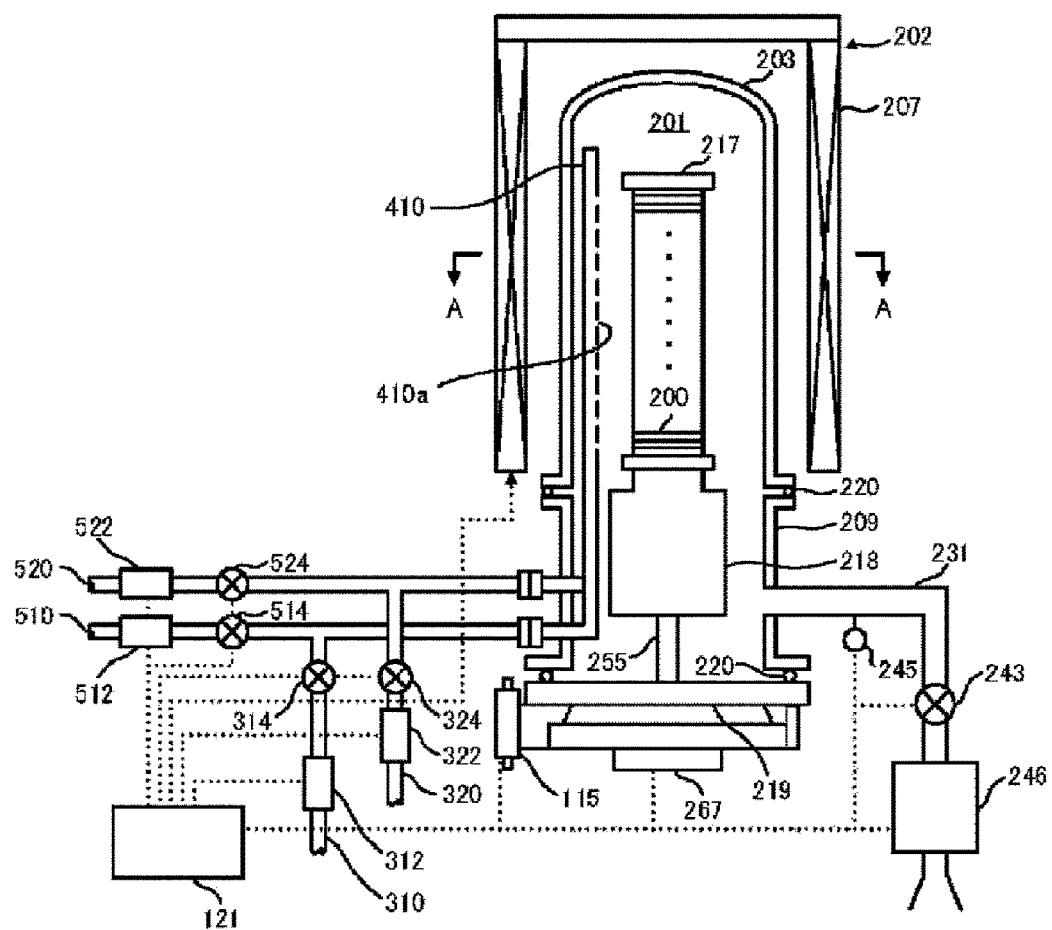
FIG. 1 is a schematic configuration diagram of a processing furnace of a substrate processing apparatus suitably used in an embodiment of the present disclosure, in which a portion of the processing furnace is shown in a vertical cross sectional view.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

First Embodiment of the Present Disclosure

Hereinafter, a first embodiment of the present disclosure will be described with reference to FIGS. 1 to 7. A substrate processing apparatus 10 is configured as an example of an apparatus used in a substrate processing process which is one of manufacturing processes of a semiconductor device.

(1) Configuration of Substrate Processing Apparatus

The configuration of the substrate processing apparatus will be described with reference to FIGS. 1 to 4. As shown in FIG. 1, a heater 207 as heating means (a heating mechanism or a heating system) is provided in a processing furnace 202. The heater 207 is formed in a cylindrical shape with its upper portion closed.

On the inner side of the heater 207, a reaction tube 203 constituting a reaction vessel (process vessel) is disposed concentrically with the heater 207. The reaction tube 203 is made of a heat resistant material or the like (for example, quartz ($SiO_2$) or silicon carbide (SiC)), and is formed in a cylindrical shape with its upper end closed and its lower end opened.

A manifold 209 made of a metallic material such as stainless steel or the like is attached to the lower end of the reaction tube 203. The manifold 209 is formed in a tubular shape, and the lower end opening thereof is hermetically closed by a seal cap 219 as a lid. O-rings 220 are provided between the reaction tube 203 and the manifold 209 and between the manifold 209 and the seal cap 219, respectively. A process container is mainly configured by the reaction tube 203, the manifold 209 and the seal cap 219. A process chamber 201 is formed inside the process container. Wafers 200 as substrates are supported by a boat 217 accommodated in the process chamber 201 in a state in which the wafers 200 as substrates are aligned in multiple stages in a vertical direction and in a horizontal posture, whereby the wafers 200 can be accommodated in the process chamber 201.

On the opposite side of the seal cap 219 from the process chamber 201, a rotation mechanism 267 for rotating the boat 217 is provided. A rotating shaft 255 of the rotation mechanism 267, which passes through the seal cap 219, is connected to the boat 217. The rotation mechanism 267 is configured to rotate the wafers 200 by rotating the boat 217. A boat elevator 115 is configured so as to load and unload the boat 217 into and from the process chamber 201 by raising and lowering the seal cap 219. In other words, the boat elevator 115 is configured as a transfer device (transfer mechanism) that transfers the boat 217, namely the wafers 200 into and out of the process chamber 201.

The boat 217 as a substrate support tool is configured so as to support a plurality of wafers 200, for example, 25 to 200 wafers 200 in a horizontal posture and in multiple stages by vertically aligning the wafers 200 in a state in which the centers thereof are aligned with each other, namely so as to arrange the wafers 200 in a spaced-apart relationship. The boat 217 is made of a heat resistant material or the like (for example, quartz or SiC). Heat insulating plates 218 made of a heat resistant material or the like (for example, quartz or SiC) are supported in a horizontal posture in multiple stages in the lower portion of the boat 217. With this configuration, the heat generated from the heater 207 is less likely to be transmitted toward the seal cap 219. However, the present disclosure is not limited to the above-described embodiment. For example, a heat insulating cylinder configured as a tubular member made of a heat resistant material such as quartz or SiC may be provided in the lower portion of the boat 217 without providing the heat insulating plates 218. The heater 207 can heat the wafers 200 accommodated in the process chamber 201 to a predetermined temperature.

In the process chamber 201, nozzles 410 and 420 are provided so as to penetrate the side wall of the manifold 209. Gas supply pipes 310 and 320 as gas supply lines are connected to the nozzles 410 and 420, respectively. As described above, two nozzles 410 and 420 and two gas supply pipes 310 and 320 are provided in the reaction tube 203 and are configured to supply plural kinds of gases, in this case, two kinds of gases (process gases), into the process chamber 201 via dedicated lines, respectively.

Mass flow controllers (MFCs) 312 and 322, which are flow rate controllers (flow rate control parts), and valves 314 and 324, which are opening/closing valves, are provided in the gas supply pipes 310 and 320 in this order from the corresponding upstream side. The nozzles 410 and 420 are connected to the tip portions of the gas supply pipes 310 and 320, respectively. The nozzles 410 and 420 are configured as L-shaped long nozzles, and the horizontal portions thereof are provided so as to penetrate the side wall of the manifold 209. The vertical portions of the nozzles 410 and 420 are provided in an annular space formed between the inner wall of the reaction tube 203 and the wafers 200 so as to extend upward (upward in a stacking direction of the wafers 200) along the inner wall of the reaction tube 203 (namely, so as to extend upward from one end side to the other end side of a wafer arrangement region). In other words, the nozzles 410 and 420 are provided along the wafer arrangement region in a region horizontally surrounding the wafer arrangement region on the lateral side of the wafer arrangement region where the wafers 200 are arranged (The nozzles 410 and 420 extend in the stacking direction of the wafers 200).

Gas supply holes 410a and 420a for supplying (injecting) gases are provided on the side surfaces of the nozzles 410 and 420, respectively. The gas supply holes 410a and 420a are opened to face the center of the reaction tube 203. The gas supply holes 410a and 420a are provided in a plural number to span from the lower portion to the upper portion of the reaction tube 203. The respective gas supply holes 410a and 420a have the same opening area and are provided at the same opening pitch.

As described above, in the method of supplying gases according to the present embodiment, the gases are conveyed via the nozzles 410 and 420 disposed in an annular vertically-elongated space, namely a cylindrical space, which is defined by the inner wall of the reaction tube 203 and the end portions of the plurality of stacked wafers 200. The gases are initially injected from the gas supply holes 410a and 420a opened in the nozzles 410 and 420 into the reaction tube 203 in the vicinity of the wafers 200. The main flow of the gases in the reaction tube 203 is oriented in a direction parallel to the surfaces of the wafers 200 (substrate surfaces), namely in the horizontal direction. With such a configuration, the gases can be uniformly supplied to the respective wafers 200, and the film thickness of a thin film formed on each wafer 200 can be made uniform. The gases flowing on the surfaces of the respective wafers 200, namely the gases remaining after reaction (residual gases) flow toward an exhaust port, namely an exhaust pipe 231 to be described later. However, the flow direction of the residual gases is appropriately specified depending on the position of the exhaust port and is not limited to the vertical direction.

Carrier gas supply pipes 510 and 520 for supplying a carrier gas are connected to the gas supply pipes 310 and 320, respectively. MFCs 512 and 522 and valves 514 and 524 are provided in the carrier gas supply pipes 510 and 520.

As an example of the above configuration, a precursor gas containing a metal element (metal-containing gas) is supplied as a process gas from the gas supply pipe 310 into the process chamber 201 via the MFC 312, the valve 314 and the nozzle 410. As a precursor, it may be possible to use, for example, titanium tetrachloride ($TiCl_4$) which contains titanium (Ti) as a metal element and which is a halogen-based precursor (also referred to as a halide or a halogen-based titanium precursor). Ti is classified as a transition metal element. The halogen-based precursor is a precursor containing a halogen group. The halogen group includes a chloro group, a fluoro group, a bromo group, an iodo group and the like. That is, the halogen group includes a halogen element such as chlorine (Cl), fluorine (F), bromine (Br), iodine (I) or the like.

An N-containing gas as a reaction gas containing nitrogen (N) is supplied as a process gas from the gas supply pipe 320 into the process chamber 201 via the MFC 322, the valve 324 and the nozzle 420. As the N-containing gas, it may be possible to use a metal-element-free N-containing gas, for example, an ammonia ($NH_3$) gas. $NH_3$ acts as a nitriding/reducing agent (nitriding/reducing gas).

For example, a nitrogen ($N_2$) gas as an inert gas is supplied from the carrier gas supply pipes 510 and 520 into the process chamber 201 via the MFCs 512 and 522, the valves 514 and 524, and the nozzles 410 and 420, respectively. Hereinafter, an example in which an $N_2$ gas is used as an inert gas will be described. As the inert gas, a rare gas such as an Ar gas, a He gas, an Ne gas, a Xe gas or the like may be used in addition to the $N_2$ gas.

As used herein, the term "precursor gas" refers to a precursor in a gaseous state, for example, a gas obtained by vaporizing or subliming a precursor which stays in a liquid state or a solid state under a room temperature and an atmospheric pressure, or a precursor which stays in a gaseous state under a room temperature and an atmospheric pressure. When the term "precursor" is used herein, it may refer to a "liquid precursor in a liquid state", a "solid precursor in a solid state", a "precursor gas in a gaseous state", or a combination thereof. In the case of using a liquid precursor such as $TiCl_4$ or the like staying in a liquid state under a room temperature and an atmospheric pressure, or a solid precursor such as $AlCl_3$ or the like staying in a solid state under a room temperature and an atmospheric pressure, the liquid precursor or the solid precursor is vaporized or sublimated by a system such as a vaporizer, a bubbler or a sublimator and is supplied as a precursor gas (a $TiCl_4$ gas, an $AlCl_3$ gas, etc.).

In the case of supplying the aforementioned process gas from the gas supply pipes 310 and 320, a process gas supply system is mainly configured by the gas supply pipes 310 and 320, the MFCs 312 and 322, and the valves 314 and 324. The nozzles 410 and 420 may be included in the process gas supply system. The process gas supply system may be simply referred to as a gas supply system.

In the case of supplying a metal-containing gas as the aforementioned precursor gas from the gas supply pipe 310, a metal-containing gas supply system as a precursor gas supply system is mainly configured by the gas supply pipe 310, the MFC 312 and the valve 314. The nozzle 410 may be included in the precursor gas supply system. The precursor gas supply system may also be referred to as a precursor supply system.

In the case of supplying a halogen-based precursor gas as the precursor gas from the gas supply pipe 310, a halogen-based precursor gas supply system is mainly configured by the gas supply pipe 310, the MFC 312 and the valve 314. The nozzle 410 may be included in the halogen-based precursor gas supply system. The halogen-based precursor gas supply system may also be referred to as a halogen-based precursor supply system. In the case of supplying a titanium-containing gas from the gas supply pipe 310, the halogen-based precursor gas supply system may be referred to as a titanium-containing gas supply system. In the case of supplying a $TiCl_4$ gas from the gas supply pipe 310, the titanium-containing gas supply system may also be referred to as a $TiCl_4$ gas supply system. The $TiCl_4$ gas supply system may also be referred to as a $TiCl_4$ supply system.

In the case of supplying an N-containing gas as the reaction gas from the gas supply pipe 320, an N-containing gas supply system is mainly configured by the gas supply pipe 320, the MFC 322 and the valve 324. The nozzle 420 may be included in the N-containing gas supply system. The N-containing gas supply system may be referred to as a reaction gas supply system. In the case of supplying an $NH_3$ gas from the gas supply pipe 320, the reaction gas supply system may also be referred to as an $NH_3$ gas supply system. The reaction gas supply system may also be referred to as an $NH_3$ supply system.

Further, a carrier gas supply system is mainly configured by the carrier gas supply pipes 510 and 520, the MFCs 512 and 522, and the valves 514 and 524. In the case of supplying an inert gas as the carrier gas, the carrier gas supply system may also be referred to as an inert gas supply system. Since the inert gas also acts as a purge gas, the inert gas supply system may also be referred to as a purge gas supply system.

Figure 2:
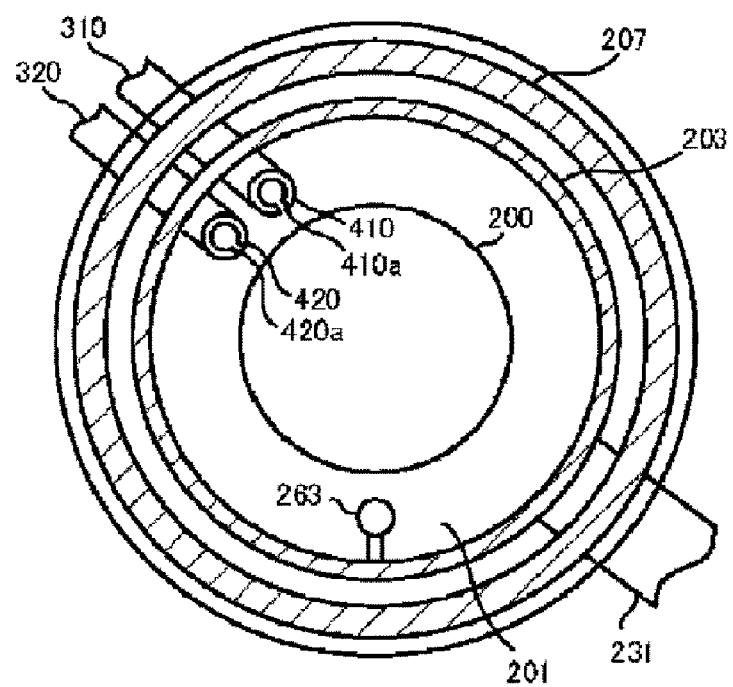
FIG. 2 is a schematic sectional view taken along line A-A in FIG. 1.

An exhaust pipe 231 for exhausting the atmosphere in the process chamber 201 is provided in the manifold 209. Similar to the nozzles 410 and 420, the exhaust pipe 231 is provided so as to penetrate the side wall of the manifold 209. As shown in FIG. 2, the exhaust pipe 231 is provided at a position where the exhaust pipe 231 faces the nozzles 410 and 420 across the wafers 200 in a plan view. With this configuration, the gases supplied from the gas supply holes 410a and 420a to the vicinity of the wafers 200 in the process chamber 201 flow in a horizontal direction, namely in a direction parallel to the surfaces of the wafers 200, and then flow downward. The gases are exhausted from the exhaust pipe 231. The main flow of the gases in the process chamber 201 becomes a flow directed in the horizontal direction as described above.

A pressure sensor 245 as a pressure detector (pressure detection part) for detecting the pressure inside the process chamber 201, an APC (Auto Pressure Controller) valve 243, and a vacuum pump 246 as a vacuum exhaust device are connected to the exhaust pipe 232 sequentially from the upstream side. The APC valve 243 is an exhaust valve and functions as a pressure regulation part. There may be a case where a trap device for trapping a reaction by-product, an unreacted precursor gas or the like contained in the exhaust gas and a scrubbing device for eliminating corrosive components and toxic components contained in the exhaust gas are connected to the exhaust pipe 232. An exhaust system, namely an exhaust line is mainly configured by the exhaust pipe 231, the APC valve 243 and the pressure sensor 245. The vacuum pump 246 may be included in the exhaust system. Furthermore, the trap device and the scrubbing device may be included in the exhaust system.

The APC valve 243 is configured so that the vacuum evacuation of the interior of the process chamber 201 can be performed and stopped by opening and closing the APC valve 243 while operating the vacuum pump 246 and so that the pressure inside the process chamber 201 can be regulated by adjusting the opening degree of the APC valve 243 while operating the vacuum pump 246. The APC valve 243 constitutes a part of an exhaust flow path of the exhaust system. The APC valve 243 functions not only as a pressure regulation part but also as an exhaust flow path opening/ closing part, namely an exhaust valve capable of closing or hermetically sealing the exhaust flow path of the exhaust system.

A temperature sensor 263 as a temperature detector is installed in the reaction tube 203. By adjusting the amount of current supplied to the heater 207 based on the temperature information detected by the temperature sensor 263, the temperature inside the process chamber 201 can be set to have a specified temperature distribution. Similar to the nozzles 410 and 420, the temperature sensor 263 is formed in an L shape and is provided along the inner wall of the reaction tube 203.

Figure 3:
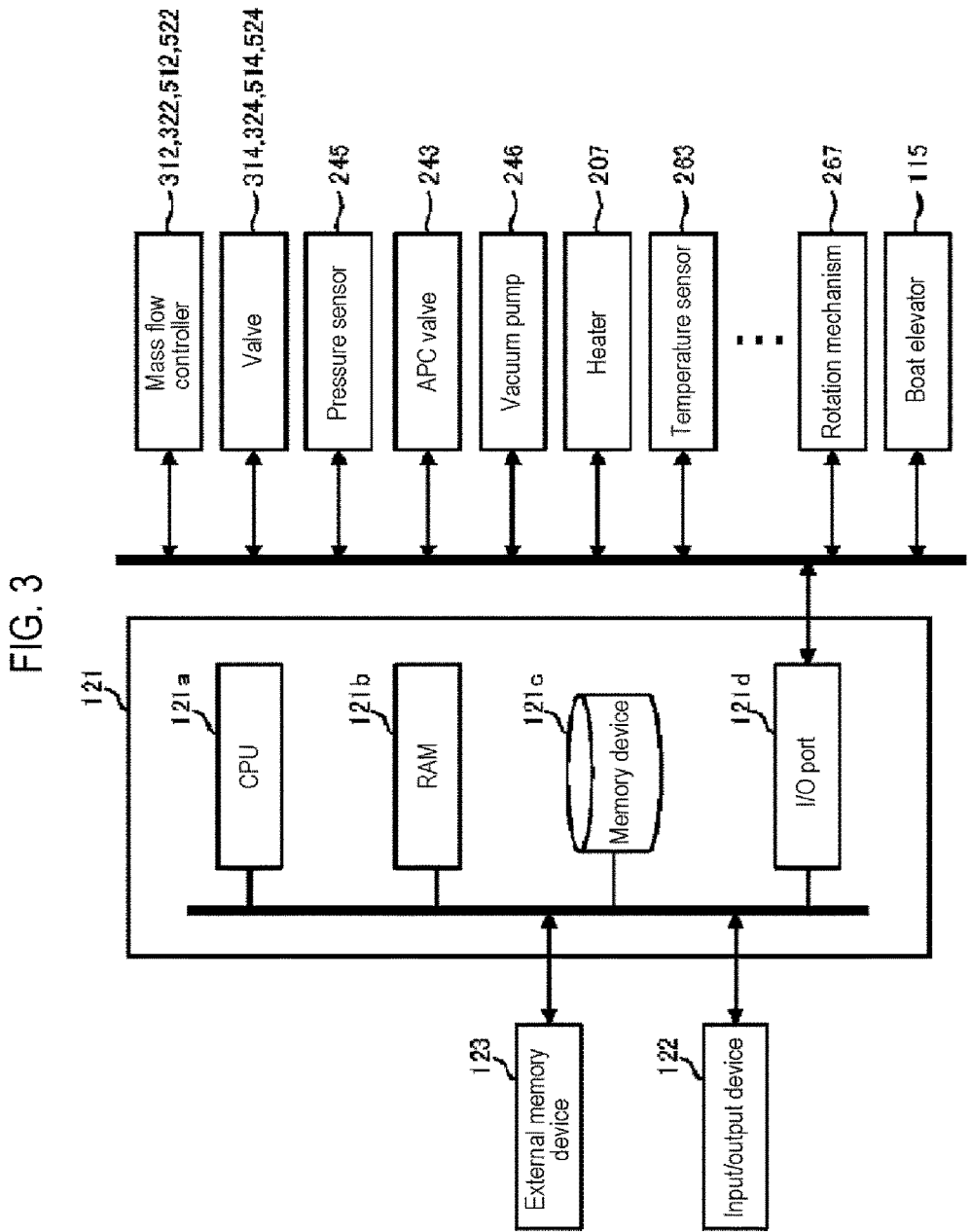
FIG. 3 is a block diagram showing a configuration of a controller of the substrate processing apparatus shown in FIG. 1.

As shown in FIG. 3, a controller 121, which is a control part (control means), is configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus. An input/output device 122 configured as, for example, a touch panel or the like is connected to the controller 121.

The memory device 121c is composed of, for example, a flash memory, an HDD (Hard Disk Drive), and the like. A control program for controlling the operations of a substrate processing apparatus, a process recipe for specifying sequences and conditions of a substrate processing process to be described later, or the like is readably stored in the memory device 121c. The process recipe functions as a program for causing the controller 121 to execute each sequence in the substrate processing process, as described later, to obtain a predetermined result. Hereinafter, the process recipe and the control program will be generally and simply referred to as a "program." When the term "program" is used herein, it may indicate a case of including only the process recipe, a case of including only the control program, or a case of including both the process recipe and the control program. The RAM 121b is configured as a memory area (work area) in which a program or data read by the CPU 121a is temporarily stored.

The I/O port 121d is connected to the MFCs 312, 322, 512 and 522, the valves 314, 324, 514 and 524, the APC valve 243, the pressure sensor 245, the vacuum pump 246, the heater 207, the temperature sensor 263, the rotation mechanism 267, the boat elevator 115, and the like.

The CPU 121a is configured to read the control program from the memory device 121c and execute the same. The CPU 121a is also configured to read the process recipe from the memory device 121c according to an input of an operation command from the input/output device 122. The CPU 121a is configured to control, according to the contents of the process recipe thus read, the flow rate adjusting operation of various kinds of gases by the MFCs 312, 322, 512 and 522, the opening/closing operation of the valves 314, 324, 514 and 524, the opening/closing operation of the APC valve 243, the pressure regulating operation performed by the APC valve 243 based on the pressure sensor 245, the temperature adjusting operation of the heater 207 performed based on the temperature sensor 263, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, and the like.

The controller 121 is not limited to being configured as a dedicated computer but may be configured as a general-purpose computer. For example, the controller 121 according to the present disclosure may be configured by preparing an external memory device (for example, a magnetic tape, a magnetic disk such as a flexible disk or a hard disk, an optical disk such as a CD or a DVD, a magneto-optical disk such as an MO, or a semiconductor memory such as a USB memory or a memory card) 123, which stores the aforementioned program, and installing the program in a general-purpose computer using the external memory device 123. The means for supplying the program to the computer is not limited to the case of supplying the program via the external memory device 123. For example, the program may be supplied to the computer using a communication means such as the Internet or a dedicated line, instead of using the external memory device 123. The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123.

Figure 4B:
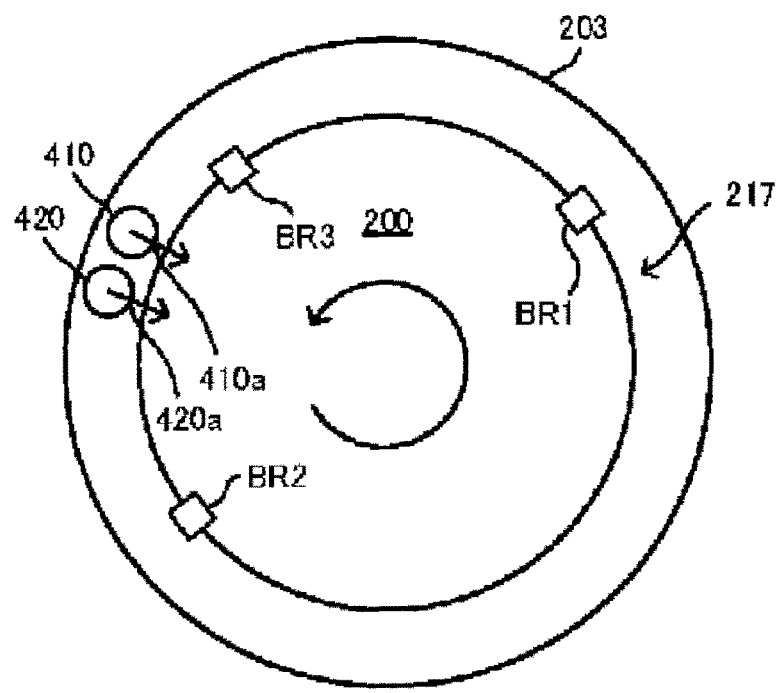
FIG. 4B is a schematic sectional view taken along line B-B in FIG. 4A.
Figure 4C:
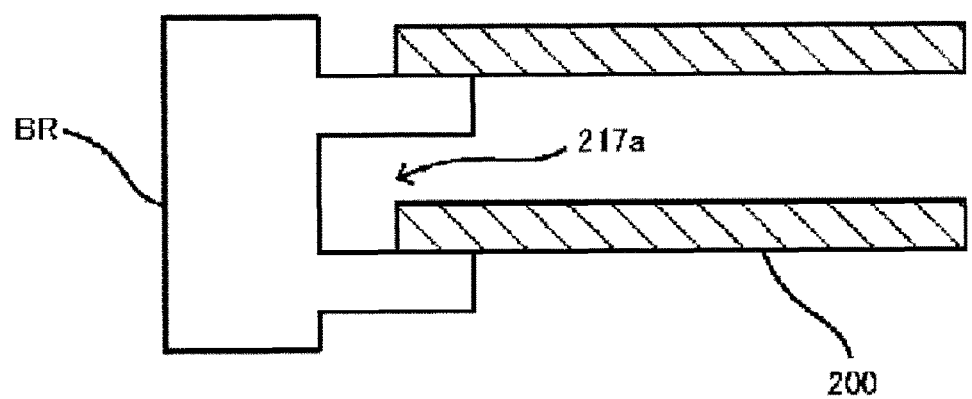
FIG. 4C is a schematic sectional view enlarging and showing a portion surrounded by a dotted line in FIG. 4A.

Next, the manner of supporting the wafers 200 by the boat 217 and the manner of supplying the process gas from the nozzles 410 and 420 to the wafers 200 will be described in more detail with reference to FIGS. 4A to 4C.

The boat 217 includes a plurality of (three or more) boat rails BR provided along the circumferential direction of the wafers 200 supported by the boat 217 and extending in the vertical direction. Hereinafter, the boat rails BR may be simply referred to as rails BR. In this example, the boat 217 three rails BR 1, BR 2 and BR 3 are illustrated. A plurality of support grooves 217a is provided side by side in the vertical direction on the inner peripheral side of each rail BR. The wafers 200 can be locked in the respective support grooves 217a. In this manner, the wafers 200 are supported on the boat 217 by the rails BR.

The spacing between the adjacent rails BR or the width of the opening formed between the adjacent rails BR can be represented by a sectorial central angle formed by the rails and the center of the wafers 200. By setting the spacing between the rails forming the widest opening to 180° or more, the wafers 200 can be attached to and detached from the boat 217 via the widest opening. In this example, the rail BR1 and the rail BR2 are spaced apart by 180°, whereby the widest opening is formed between the rail BR1 and the rail BR2. The rail BR2 and the rail BR3 are spaced apart by 90°, and the rail BR3 and the rail BR1 are spaced apart by 90°.

The process gas is supplied to the wafers 200 from the gas supply holes 410a and 420a. The gas supply holes 410a and 420a are arranged outer side of the wafers 200 in the direction parallel to the substrate surface. That is, the gas supply holes 410a and 420a are arranged on the outer side in the horizontal direction of the wafers 200. Specifically, the gas supply holes 410a and 420a are arranged further outside from a center of the wafers 200 than peripheral edges of the wafers 200 in the horizontal direction. At this time, for the purpose of assuring the uniformity in the rotational direction, the process gas is supplied while rotating the boat 217 supporting the wafers 200 by the rotation mechanism 267 shown in FIG. 1. In this regard, the positions of the gas supply holes 410a and 420a in the process chamber 201 are fixed. Therefore, the positions of the gas supply holes 410a and 420a with respect to the wafers 200, namely the rotational direction positions of the gas supply holes 410a and 420a as viewed from the center of the wafers 200 are changed in response to the rotation of the wafers 200.

On the other hand, since the boat 217 rotates together with the wafers 200, the positions of the rails BR1 to BR3 with respect to the wafers 200, namely the rotational direction positions of the rails BR1 to BR3 as viewed from the center of the wafers 200 is not changed with rotation.

Hereinafter, the positions of the gas supply holes 410a and 420a in the rotational direction as viewed from the center of the wafers 200 may be simply referred to as "the rotational direction positions of the gas supply holes." In order to avoid complication of the description, the description will be continued under the simplified assumption that the rotational direction position of the gas supply hole 410a is the same as the rotational direction position of the gas supply hole 420a. In addition, the rotational direction positions of the rails BR as viewed from the center of the wafers 200 may be simply referred to as "the rotational direction position of the rails BR."

(2) Substrate Processing Process (Film Forming Process)

As one of the manufacturing processes of a semiconductor device, an example of a process of forming, for example, a metal film constituting a gate electrode on a substrate will be described with reference to FIGS. 5 and 6. The process of forming the metal film is performed by using the processing furnace 202 of the substrate processing apparatus 10 described above. In the following description, the operations of the respective parts constituting the substrate processing apparatus 10 are controlled by the controller 121.

In the substrate processing process (the manufacturing process of the semiconductor device) according to the present embodiment, there are performed: a step of rotating the boat 217 as a substrate support tool which is accommodated in the process chamber 201 and in which the wafers 200 as substrates are supported by the rails BR; and a step of supplying a process gas including a TiCl$_4$ gas as a first gas to the wafers 200 from the gas supply holes 410a positioned on the outer side in the horizontal direction of the wafers 200 while rotating the boat 217. In the step of supplying the process gas, the TiCl$_4$ gas is supplied to the wafers 200 in a period in which the rails BR are not positioned exist between the gas supply hole 410a and the wafers 200.

As used herein, the term "wafer" may refer to "a wafer itself" or "a laminated body (an assembly) of a wafer and a predetermined layer or film formed on a surface of the wafer" (namely, a wafer including a predetermined layer or film formed on its surface may be referred to as a wafer). In addition, as used herein, the phrase "a surface of a wafer" may refer to "a surface (exposed surface) of a wafer itself" or "a surface of a predetermined layer or film formed on a wafer, namely an uppermost surface of a wafer as a laminated body."

Accordingly, as used herein, the expression "a predetermined gas is supplied to a wafer" may mean that "a predetermined gas is directly supplied to a surface (exposed surface) of a wafer itself" or that "a predetermined gas is supplied to a layer or film formed on a wafer, namely on an uppermost surface of a wafer as a laminated body." Furthermore, as used herein, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

The term "substrate" used herein may be synonymous with the term "wafer." In this case, the terms "wafer" and "substrate" may be used interchangeably in the foregoing description.

As used herein, the term "metal film" means a film composed of a conductive substance containing metal atoms and includes a conductive metal nitride film (metal nitride film), a conductive metal oxide metal oxide film (metal oxide film), a conductive metal oxynitride film (metal oxynitride film), a conductive metal composite film, a conductive metal alloy film, a conductive metal silicide film (metal silicide film), a conductive metal carbide film (metal carbide film), conductive metal carbonitride film (metal carbonitride film), and the like. The titanium film (Ti film) is a conductive metal film and the titanium nitride film (TiN film) is a conductive metal nitride film.

As used herein, the term "time division" means that something is divided (separated) in time. For example, as used herein, the expression "the respective processes are performed time-divisionally" means that the respective processes are performed asynchronously (non-simultaneously), namely that that the respective processes are performed without synchronization (not performed at the same time). In other words, the expression "the respective processes are performed time-divisionally" means that the respective processes are performed intermittently (in a pulse-wise manner) and alternately. That is, the expression "the respective processes are performed time-divisionally" means that the process gases supplied in the respective processes are supplied so as not to be mixed with each other. When the respective processes are performed a plurality of times, the process gases supplied in the respective processes are alternately supplied so as not to be mixed with each other.

(Wafer Charging and Boat Loading)

When a plurality of wafers 200 is loaded in the boat 217 (wafer charging), as shown in FIG. 1, the boat 217 supporting the wafers 200 is lifted by the boat elevator 115 and is loaded into the process chamber 201 (boat loading). In this state, the seal cap 219 closes the lower end opening of the reaction tube 203 via the O-ring 220.

(Pressure Regulation and Temperature Adjustment)

The interior of the process chamber 201 is evacuated by the vacuum pump 246 so as to have a specified pressure (vacuum degree). At this time, the pressure inside the process chamber 201 is measured by the pressure sensor 245. The APC valve 243 is feedback controlled based on the measured pressure information (pressure regulation). The vacuum pump 246 is always maintained in an operating state at least until the processing on the wafers 200 is completed. Further, the interior of the process chamber 201 is heated by the heater 207 so as to have a specified temperature. At this time, the amount of a current supplied to the heater 207 is feedback controlled based on the temperature information detected by the temperature sensor 263 so that the interior of the process chamber 201 has a specified temperature distribution (temperature adjustment). The heating of the interior of the process chamber 201 by the heater 207 is continued at least until the processing on the wafers 200 is completed.

(Boat Rotation)

Subsequently, the rotation of the boat 217 and the wafers 200 is started by the rotation mechanism 267. The rotation of the boat 217 and the wafers 200 by the rotation mechanism 267 is continued at least until the processing on the wafers 200 is completed. In this regard, as an example, description will be continued assuming that the rotation speed is, for example, 2.5 rpm, namely that the rotation period is, for example, 24 seconds.

(TiN Film Forming Step)

Subsequently, a step of forming a metal film, for example, a TiN film which is a metal nitride film, is executed. The TiN film forming step includes a TiCl$_4$ gas (precursor gas) supply step, a residual gas removal step, an NH$_3$ gas (reaction gas) supply step, and a residual gas removal step, which will be described below.

Figure 5A:
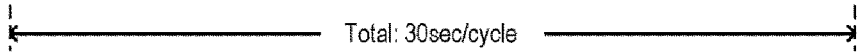
FIG. 5A shows an example of a process gas supply sequence (for one cycle)

FIG. 5A shows an example of a process gas supply sequence that defines a procedure in one cycle of supply of a process gas for forming a TiN film. As in this sequence, the start timing and stop timing of supply of a TiCl$_4$ gas as a first gas in the cycle are defined. Furthermore, as in this sequence, the start timing and stop timing of supply of an NH$_3$ as a second gas are defined so that the TiCl$_4$ gas as the first gas and the NH$_3$ gas as the second gas (of a type having a different chemical structure from the first gas) are supplied time-divisionally (alternately).

In this regard, the following process gas supply sequence will be cited as an example, and the description will be continued. In the process gas supply sequence, for example, the total length (cycle time) is set to 30 seconds. Three seconds from 0 second (sequence start timing) to 3 second is a TiCl$_4$ gas supply period, namely a period in which the TiCl$_4$ gas supply step is performed. Six seconds from 3 second to 9 second is a purge period, namely a period in which the residual gas removal step is performed. Fifteen seconds from 9 second to 24 second is an NH$_3$ gas supply period, namely a period in which the NH$_3$ gas supply step is performed. Six seconds from 24 second to 30 second is a purge period, namely a period in which the residual gas removal step is performed.

As shown in FIG. 5B, the process gas is supplied by repeating such a sequence. The process gas is supplied in a state in which the boat 217 and the wafers 200 are rotating. The rotation period of the boat 217 and the wafers 200 is selected to be, for example, 24 seconds, and the length (cycle time) of the process gas supply sequence for one cycle is selected to be, for example, 30 seconds. Since the rotation period and the length of the process gas supply sequence are not equal to each other, each time when the process gas supply sequence is repeated, for example, the rotational direction position of the gas supply holes at the start timing of each sequence is shifted.

The rotational direction position of the gas supply holes (gas supply holes 410a) at the start timing of a first cycle (the sequence to be performed at the first time) is set to 0° of the first rotation and is used as a reference of the rotational direction position. The rotational direction positions of the gas supply holes at the start timings of a second cycle (the sequence to be performed at the second time), a third cycle (the sequence to be performed at the third time) and a fourth cycle (the sequence to be performed at the fourth time) are, 90° of the second rotation, 180° of the third rotation, and 270° of the fourth rotation, respectively. The rotational direction position of the gas supply holes at the start timing of a fifth cycle (the sequence to be performed at the fifth time) is 360° of the fifth rotation, namely 0° of the sixth rotation.

Therefore, in this example, when the process gas supply sequence is completed exactly four times (four cycles), the rotation of the wafers 200 is completed exactly five times, whereby the rotational direction position of the gas supply holes at the start timing of the fifth cycle becomes equal to the rotational direction position of the gas supply holes at the start timing of the first cycle. In other words, in this example, the relationship between the length of the process gas supply sequence and the rotation period of the boat 217 (the wafers 200) is selected so that, each time when the process gas supply sequence is repeated a predetermined number of times (more specifically, four times), the process gas supply sequence start timing is synchronized with the rotation timing of the boat 217 (the wafers 200).

In the fifth and subsequent cycles, the same timing relationship as the first to fourth cycles is repeated. The period from a synchronization timing of the start timing of the process gas supply sequence and the rotation timing of the wafers 200 to the next synchronization timing thereof (in this example, the period from the start timing of the first cycle to the start timing of the fifth cycle) will be referred to as a synchronization unit period.

Such a relationship may be expressed as follows using a mathematical formula. It is assumed that the length (cycle time) of the process gas supply sequence for one cycle is Tspl and the number of cycles is a. Furthermore, it is assumed that the rotation period of the boat 217 (the wafers 200) is Trot and the number of rotations is b. The relationship that the rotation of the wafers is completed b times when the process gas supply sequence is completed a times is expressed as aTspl=bTrot. In this regard, for example, when Tspl=30 seconds and Trot=24 seconds, the above formula becomes 30a=24b. The minimum values of a and b that satisfy such a relationship are a=4 and b=5. That is, when the process gas supply sequence is completed four times, the rotation of the wafers 200 is completed five times.

Figure 6A:
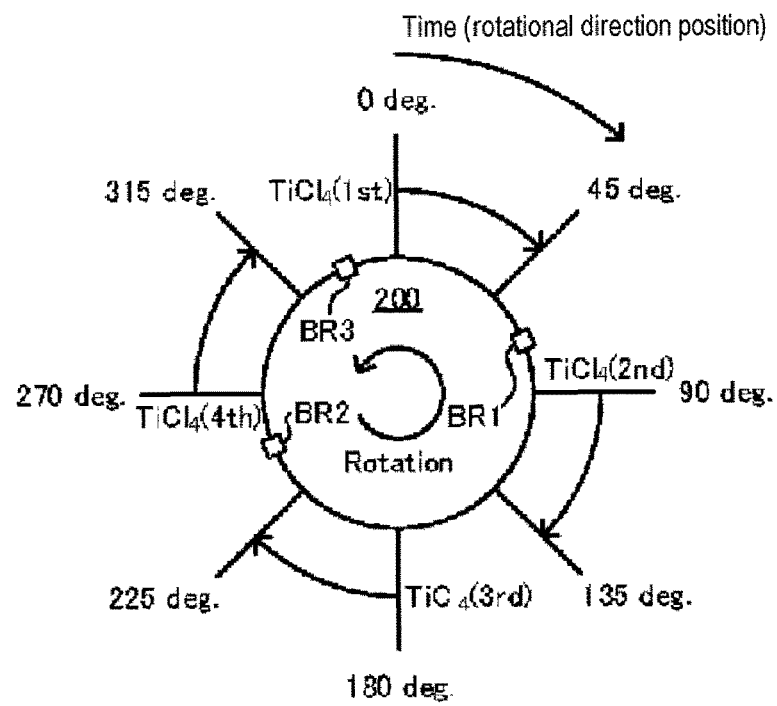
FIG. 6A and FIG. 6B are schematic diagrams showing the supply ranges of a $TiCl_4$ gas and an $NH_3$ gas on a wafer in the first embodiment.

The rotational direction positions of the gas supply holes 410a in the TiCl$_4$ gas supply periods of the first cycle to the fourth cycle are respectively moved within the ranges of 0° of the first rotation to 45° of the first rotation, 90° of the second rotation to 135° of the second rotation, 180° of the third rotation to 225° of the third rotation, and 270° of the fourth rotation to 315° of the fourth rotation. In other words, the TiCl$_4$ gas supply ranges in the first cycle to the fourth cycle are the ranges of 0° to 45°, 90° to 135°, 180° to 225°, and 270° to 315°, respectively. The breadth of the supply range of the TiCl$_4$ gas for one cycle is 45°. FIG. 6A collectively shows the supply ranges of the TiCl$_4$ gas on the wafers 200 in the first to fourth cycles.

In this example, the rotational direction positions of the rails BR1 to BR3 of the boat 217 are set to 67.5°, 247.5°, and 337.5°, respectively. The rails BR1 to BR3 are not arranged within any of the supply ranges of the TiCl$_4$ gas in the first to fourth cycles. In other words, during the supply period of the TiCl$_4$ gas, the rails BR1 to BR3 are not positioned between the gas supply holes 410a for supplying the TiCl$_4$ gas and the wafers 200 (The gas supply holes 410a and the rails BR1 to BR3 are not opposed to each other). That is, the rails BR1 to BR3 do not exist at such a position that the angle between the gas flow of the process gas injected from the gas supply holes 410a and the peripheral edges of the wafers 200 is a right angle.

As described above, in the step of supplying the process gas according the present embodiment, the TiCl$_4$ gas is supplied to the wafers 200 in a period in which the rails BR1 to BR3 are not positioned between the gas supply holes 410a and the wafers 200. More specifically, in any of the process gas supply sequences performed during the synchronization unit period, during the TiCl$_4$ gas supply period defined by the process gas supply sequence, the TiCl$_4$ gas may be supplied to the wafers 200 in a period in which the rails BR1 to BR3 are not positioned between the gas supply holes 410a and the wafers 200. It may be said that the supply of the TiCl$_4$ gas is stopped at the timing at which the rails BR1 to BR3 exist between the gas supply holes 410a and the wafers 200.

Figure 6B:
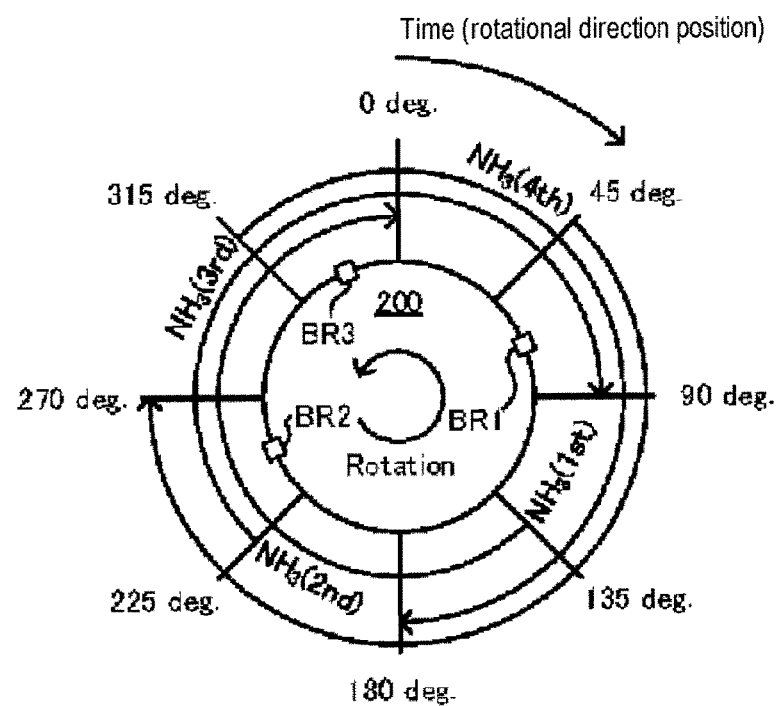

The rotational direction positions of the gas supply holes 420a in the $NH_3$ gas supply periods of the first cycle to the fourth cycle are respectively moved within the ranges of 135° of the first rotation to 360° of the first rotation (0° of the second rotation), 225° of the second rotation to 90° of the third rotation, 315° of the third rotation to 180° of the fourth rotation, and 45° of the fifth rotation to 270° of the fifth rotation. In other words, the $NH_3$ gas supply ranges in the first cycle to the fourth cycle are the ranges of 135° to 360° (0°, 225° to 90°, 315° to 180°, and 45° to 270°, respectively. The breadth of the supply range of the $NH_3$ gas for one cycle is 225°. FIG. 6B collectively shows the supply ranges of the $NH_3$ gas on the wafers 200 in the first to fourth cycles.

The breadth of the supply range of the $NH_3$ gas for one cycle is 225°, which is larger than the spacing of 180° between the most distantly adjacent rails BR1 and BR2. Therefore, in any of the process gas supply sequences performed during the synchronization unit period, the timing at which the rails BR1 to BR4 (any one of them) exist between the gas supply holes 420a and the wafers 200 is included in the $NH_3$ gas supply period defined by the process gas supply sequence. In the first embodiment, as for the $NH_3$ gas, there is illustrated an example where the process gas is supplied not only in a period in which the rails BR1 to BR3 are not positioned between the gas supply holes 420a and the wafers 200 but also in a period in which the rails BR1 to BR3 are positioned between the gas supply holes 420a and the wafers 200.

Hereinafter, each of the $TiCl_4$ gas supply step, the residual gas removal step, the $NH_3$ gas supply step and the residual gas removal step will be described in more detail.

($TiCl_4$ Gas Supply Step)

The valve 314 is opened, and the $TiCl_4$ gas as a precursor gas is caused to flow through the gas supply pipe 310. The flow rate of the $TiCl_4$ gas flowing through the gas supply pipe 310 is adjusted by the MFC 312. The flow-rate-adjusted $TiCl_4$ gas is supplied into the process chamber 201 from the gas supply holes 410a of the nozzle 410 and is exhausted from the exhaust pipe 231. At this time, the $TiCl_4$ gas is supplied to the wafers 200. That is, the surfaces of the wafers 200 are exposed to the $TiCl_4$ gas. Simultaneously, the valve 514 is opened, and an inert gas such as an $N_2$ gas or the like is caused to flow through the carrier gas supply pipe 510. The flow rate of the $N_2$ gas flowing through the carrier gas supply pipe 510 is adjusted by the MFC 512. The flow-rate-adjusted $N_2$ gas is supplied into the process chamber 201 together with the $TiCl_4$ gas and is exhausted from the exhaust pipe 231. At this time, in order to prevent intrusion of the $TiCl_4$ gas into the nozzle 420, the valve 524 is opened and the $N_2$ gas is caused to flow through the carrier gas supply pipe 520. The $N_2$ gas is supplied into the process chamber 201 via the gas supply pipe 320 and the nozzle 420 and is exhausted from the exhaust pipe 231.

At this time, the APC valve 243 is appropriately adjusted so that the pressure inside the process chamber 201 is set to, for example, a pressure in a range of 1 to 70,000 Pa, specifically 1 to 1330 Pa, for example, 20 to 50 Pa. The supply flow rate of the $TiCl_4$ gas controlled by the MFC 312 is set to, for example, a flow rate in a range of 0.05 to 2 slm, specifically 0.15 to 1 slm, for example, 0.45 slm. The supply flow rate of the $N_2$ gas controlled by the MFCs 512 and 522 is set to, for example, a flow rate in a range of 1 to 20 slm, specifically 5 to 15 slm, for example, 7 slm. The time period for supplying the $TiCl_4$ gas to the wafers 200, i.e., the gas supply time period (irradiation time period) is set to, for example, a time period in a range of 0.1 to 60 seconds, specifically 1 to 30 seconds, for example, 3 seconds. At this time, the temperature of the heater 207 is set to such a temperature that the temperature of the wafer 200 is, for example, a temperature in a range of 250 to 650 degrees C., specifically 300 to 550 degrees C., for example, 380 degrees C. The gases flowing into the process chamber 201 are only the $TiCl_4$ gas and the $N_2$ gas. By the supply of the $TiCl_4$ gas, for example, a Ti-containing layer having a thickness of less than one atomic layer to several atomic layers is formed on the wafer 200 (the base film on the surface).

The Ti-containing layer is rarely a Ti layer containing only Ti atoms. In reality, the Ti-containing layer often contains other atoms derived from the respective precursors. Therefore, the Ti-containing layer formed in the step of supplying the $TiCl_4$ gas as a halogen-based precursor gas often contains Cl which is a halogen-based element. That is, it can be said that the Ti-containing layer is a $TiCl_4$ layer which is an adsorption layer of $TiCl_4$. The $TiCl_4$ layer includes not only a continuous adsorption layer of $TiCl_4$ molecules but also a discontinuous adsorption layer thereof. That is, the $TiCl_4$ layer includes an adsorption layer having a thickness of one molecular layer or less than one molecular layer composed of $TiCl_4$ molecules. The $TiCl_4$ molecules constituting the $TiCl_4$ layer also include a molecule in which the bond between Ti and Cl is partially broken. That is, the $TiCl_4$ layer includes a physical adsorption layer or a chemisorption layer of $TiCl_4$. However, under the processing conditions described above, chemical adsorption is more dominant than physical adsorption of $TiCl_4$ onto the wafer 200.

In this regard, the layer having a thickness of less than one atomic layer refers to an atomic layer formed discontinuously, and the layer having a thickness of one atomic layer refers to an atomic layer formed continuously. The layer having a thickness of less than one molecular layer refers to a molecular layer formed discontinuously, and the layer having a thickness of one molecular layer refers to a molecular layer formed continuously. This also applies to the example to be described later.

(Residual Gas Removal Step)

After the Ti-containing film is formed, the valve 314 is closed and the supply of the $TiCl_4$ gas is stopped. At this time, the interior of the process chamber 201 is evacuated by the vacuum pump 246 while keeping the APC valve 243 of the exhaust pipe 231 open. The $TiCl_4$ gas unreacted or contributed to the formation of the Ti-containing film, which remains in the process chamber 201, is removed from the interior of the process chamber 201. That is, the $TiCl_4$ gas unreacted or contributed to the formation of the Ti-containing layer, which remains in a space where the wafer 200 having the Ti-containing layer exists, is removed. At this time, the valves 514 and 524 are kept open and the supply of the $N_2$ gas into the process chamber 201 is maintained. The $N_2$ gas acts as a purge gas and can enhance the effect of removing the $TiCl_4$ gas unreacted or contributed to the formation of the Ti-containing film, which remains in the process chamber 201, from the interior of the process chamber 201.

At this time, it is not necessary to completely remove the gas remaining in the process chamber 201, and it is not necessary to completely purge the interior of the process chamber 201. If the amount of the gas remaining in the process chamber 201 is very small, no adverse effect occurs in subsequent steps. It is not necessary to increase the flow rate of the $N_2$ gas supplied into the process chamber 201 to a large flow rate. For example, by supplying substantially the same amount of $N_2$ gas as the volume of the reaction tube 203 (the process chamber 201), it is possible to perform purging to such an extent that no adverse effect occurs in subsequent steps. As described above, by not completely purging the interior of the process chamber 201, it is possible to shorten the purge time and to improve the throughput. In addition, it is possible to suppress the consumption of the $N_2$ gas to a necessary minimum level.

(NH$_3$ Gas Supply Step)

After the residual gas in the process chamber 201 is removed, the valve 324 is opened, and the NH$_3$ gas, which is an N$_2$-containing gas, is caused to flow as a reaction gas through the gas supply pipe 320. The flow rate of the NH$_3$ gas flowing through the gas supply pipe 320 is adjusted by the MFC 322. The flow-rate-adjusted NH$_3$ gas is supplied into the process chamber 201 from the gas supply holes 420a of the nozzle 420. The NH$_3$ gas supplied into the process chamber 201 is activated by heat and is then exhausted from the exhaust pipe 231. At this time, the thermally activated NH$_3$ gas is supplied to the wafer 200. That is, the surface of the wafer 200 is exposed to the heat-activated NH$_3$ gas. At the same time, the valve 524 is opened, and the N$_2$ gas is caused to flow through the carrier gas supply pipe 520. The flow rate of the N$_2$ gas flowing through the carrier gas supply pipe 520 is adjusted by the MFC 522. The N$_2$ gas is supplied into the process chamber 201 together with the NH$_3$ gas and is exhausted from the exhaust pipe 231. At this time, in order to prevent entry of the NH$_3$ gas into the nozzle 410, the valve 514 is opened, and the N$_2$ gas is caused to flow through the carrier gas supply pipe 510. The N$_2$ gas is supplied into the process chamber 201 via the gas supply pipe 310 and the nozzle 410 and is exhausted from the exhaust pipe 231.

When supplying the NH$_3$ gas, the APC valve 243 is properly adjusted so that the pressure inside the process chamber 201 is set to, for example, a pressure in a range of 1 to 70,000 Pa, specifically 1 to 1330 Pa, for example, 50 to 100 Pa. The supply flow rate of the NH$_3$ gas controlled by the MFC 322 is set to, for example, a flow rate in a range of 1 to 20 slm, specifically 1 to 10 slm, for example, 7.5 slm. The supply flow rate of the N$_2$ gas controlled by the MFCs 512 and 522 is set to, for example, a flow rate in a range of 1 to 20 slm, specifically 1 to 10 slm, for example, 7 slm. The time period for supplying the thermally activated NH$_3$ gas to the wafer 200, namely the gas supply time period (irradiation time period) is set to, for example, a time period in a range of 0.01 to 300 seconds, specifically 1 to 60 seconds, for example, 15 seconds. The temperature of the heater 207 at this time is set to the same temperature as that of the TiCl$_4$ gas supply step.

At this time, only the NH$_3$ gas and the N$_2$ gas are supplied into the process chamber 201. The NH$_3$ gas undergoes a substitution reaction with at least a part of the Ti-containing layer formed on the wafer 200 in the TiCl$_4$ gas supply step. During the substitution reaction, Ti contained in the Ti-containing layer and N contained in the NH$_3$ gas are bonded to each other, whereby a TiN layer containing Ti and N is formed on the wafer 200.

(Residual Gas Removal Step)

After forming the TiN layer, the valve 324 is closed, and the supply of the NH$_3$ gas is stopped. At this time, the interior of the process chamber 201 is evacuated by the vacuum pump 246 while keeping the APC valve 243 of the exhaust pipe 231 open. The NH$_3$ gas unreacted or contributed to the formation of the TiN layer or the reaction byproduct, which remains in the process chamber 201, is removed from the interior of the process chamber 201. At this time, the valves 514 and 524 are kept open, and the supply of the N$_2$ gas into the process chamber 201 is maintained. The N$_2$ gas acts as a purge gas and can enhance the effect of removing the NH$_3$ gas unreacted or contributed to the formation of the TiN layer or the reaction byproduct, which remains in the process chamber 201, from the interior of the process chamber 201.

At this time, as in the residual gas removal step performed after the TiCl$_4$ gas supply step, it is not necessary to completely remove the gas remaining in the process chamber 201, and it is not necessary to completely purge the interior of the process chamber 201.

(Performing a Predetermined Number of Times)

By performing, one or more times (a predetermined number of times (na times)), a cycle which sequentially and time-divisionally performs the TiCl$_4$ gas supply step, the residual gas removal step, the NH$_3$ gas supply step and the residual gas supply step, a TiN film having a predetermined thickness (of, for example, 0.1 to 10 nm) is formed on the wafer 200. The cycle mentioned above may be repeated a plurality of times.

When the process gas supply sequence is repeated a plurality of times (na times) (when boat 217 is rotated nb times), na may be a multiple of 4 (namely, nb is a multiple of 5). However, na may not be a multiple of 4 (namely, nb may not be a multiple of 5). In other words, the number of repetition times na of the process gas supply sequence (and the number of rotation times nb of the boat 217) may be selected such that the period (synchronization unit period) in which the process gas supply sequence and the rotation timing of the boat 217 are synchronized is completed exactly by a integer number of times. However, this may not be the case.

In a case where the cycle is performed a plurality of times, in the respective steps at least after the second and subsequent cycles, the part described as "a gas is supplied to the wafer 200" means that "a predetermined gas is supplied to the layer formed on the wafer 200, namely the uppermost surface of the wafer 200 as a laminated body." The part described as "a predetermined layer is formed on the wafer 200" means that "a predetermined layer is formed on the layer formed the wafer 200, namely on the uppermost surface of the wafer 200 as a laminated body." This point holds true in the example to be described later.

(Purging and Atmospheric Pressure Restoration)

The valves 514 and 524 are opened. The N$_2$ gas is supplied into the process chamber 201 from each of the gas supply pipes 510 and 520 and is exhausted from the exhaust pipe 231. The N$_2$ gas acts as a purge gas, whereby the interior of the process chamber 201 is purged with an inert gas. The gas or the byproduct remaining in the process chamber 201 is removed from the interior of the process chamber 201 (purging). Thereafter, the atmosphere in the process chamber 201 is replaced by the inert gas (inert gas replacement), and the pressure inside the process chamber 201 is restored to atmospheric pressure (atmospheric pressure restoration).

(Boat Unloading and Wafer Discharging)

Thereafter, the seal cap 219 is lowered by the boat elevator 115, and the lower end of the reaction tube 203 is opened. Then, the boat 217 is unloaded from the lower end of the reaction tube 203 to the outside of the reaction tube 203 in a state in which the processed wafers 200 are supported by the boat 217 (boat unloading). Thereafter, the processed wafers 200 are taken out from the boat 217 (wafer discharging).

Effects according to the Present Embodiment

According to the present embodiment, one or more effects described below may be achieved.

Figure 7:
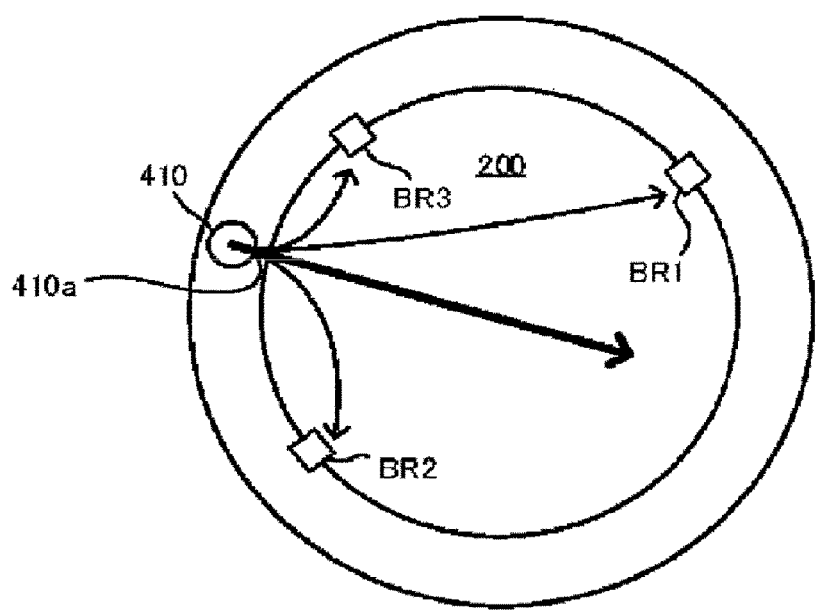
FIG. 7 is a schematic diagram showing the flow of the $TiCl_4$ gas in the first embodiment.

In the present embodiment, the TiCl$_4$ gas is supplied to the wafers 200 at a timing selected so that the rails BR1 to BR3 do not exist between the gas supply holes 410a and the wafers 200. Thus, in the present embodiment, as shown in FIG. 7, the TiCl$_4$ gas supplied from the gas supply holes 410a flows toward the center of the wafers 200 without colliding with the rails BR1 to BR3. The TiCl$_4$ gas is also easily supplied to the wafer portions around the rails BR1 to BR3. In FIG. 7, the schematic flow of the TiCl$_4$ gas is indicated by arrows, and the magnitude of the gas supply amount is schematically indicated by the thickness of arrows.

Figure 10A:
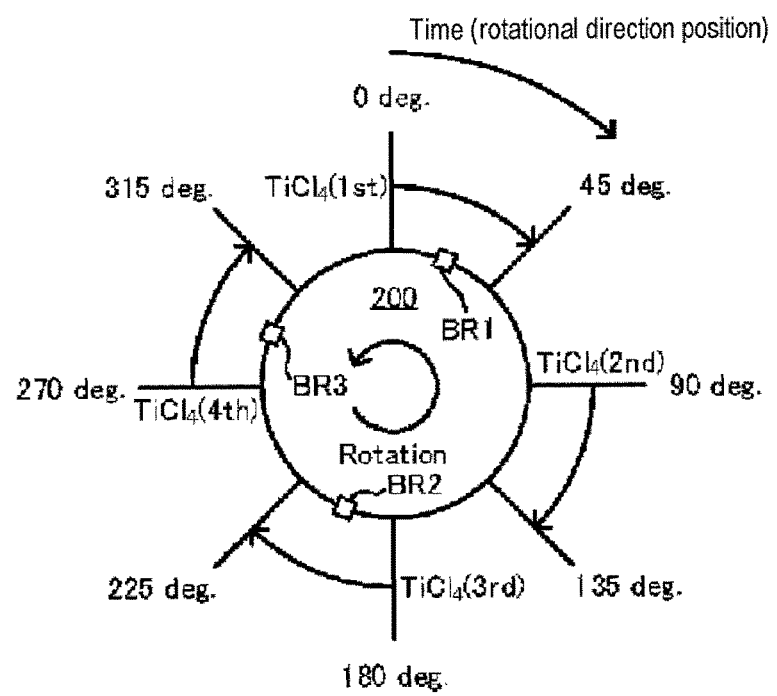
FIG. 10A is a schematic view showing the supply range of a $TiCl_4$ gas on a wafer in a comparative embodiment.

Now, a comparative embodiment will be described. In the comparative embodiment, as shown in FIG. 10A, the TiCl$_4$ gas is supplied to the wafers 200 at a timing at which the rails BR1 to BR3 exist between the gas supply holes 410a and the wafers 200. More specifically, in the comparative embodiment, the start timing of the process gas supply sequence shown in FIG. 5A is deviated from that of the above-described embodiment so that, during the TiCl$_4$ gas supply period, the rails BR1 to BR3 exist between the gas supply holes 410a and the wafers 200.

Figure 10B:
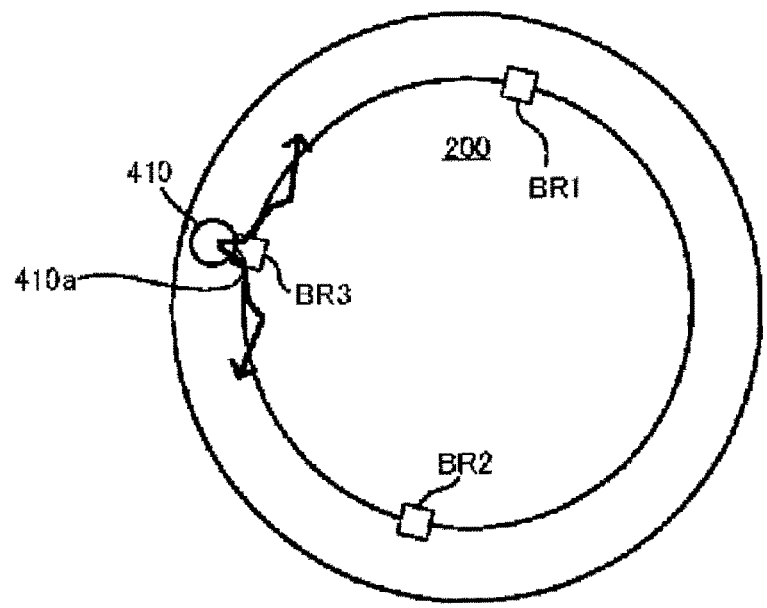
FIG. 10B is a schematic diagram showing the flow of a $TiCl_4$ gas in a comparative embodiment.

In the comparative embodiment, as shown in FIG. 10B, the TiCl$_4$ gas supplied from the gas supply holes 410a collides with the rail BR such as the rail BR3 or the like and diffuses in the lateral direction. Thus, the amount of the TiCl$_4$ gas supplied to the center of the wafers 200 decreases. Furthermore, at least the wafer portions around the rail BR with which the TiCl$_4$ gas collides is shadowed by the rail BR. Therefore, the supply amount of the TiCl$_4$ gas is remarkably decreased as compared with the case where no collision occurs. As described above, the smooth supply of the TiCl$_4$ gas to the wafers 200 is inhibited by the collision of the TiCl$_4$ gas with the rail BR, thereby reducing the deposition rate in the portions where the supply of the TiCl$_4$ gas is inhibited. As a result, the in-plane uniformity of film formation deteriorates.

On the other hand, in the present embodiment, the inhibition of the flow of the TiCl$_4$ gas by the rails BR1 to BR3 is suppressed. Therefore, as compared with the comparative embodiment, the partial reduction in the deposition rate described above is suppressed. It is therefore possible to improve the in-plane uniformity of film formation.

In the first embodiment, as for the supply of the NH$_3$ gas, the collision of the gas flow with the rails BR1 to BR3 occurs. However, if at least one type of gas, for example, a TiCl$_4$ gas, among plural types of gases included in the process gas, is supplied while suppressing collision of a gas flow with the rails BR1 to BR3 as described above, it is possible to suppress the partial reduction in the deposition rate described above and to improve the in-plane uniformity of film formation, as compared with the case where all types of gases are supplied without suppressing collision of a gas flow with the rails BR1 to BR3.

Second Embodiment of the Present Disclosure

In the first embodiment, there has been described an example where as for the TiCl$_4$ gas, the process gas is supplied at a timing selected so that the rails BR1 to BR3 do not exist between the gas supply holes 410a and the wafers 200, but as for the NH$_3$ gas, the process gas is supplied not only at a timing at which the rails BR1 to BR3 do not exist between the gas supply holes 420a and the wafers 200 but also at a timing at which the rails BR1 to BR3 exist between the gas supply holes 420a and the wafers 200.

In the second embodiment, as will be described in detail below, as for the NH$_3$ gas, the supply of the process gas is suppressed at the timing at which the rails BR1 to BR3 exist between the gas supply holes 420a and the wafers 200. In the second embodiment, the supply mode of NH$_3$ gas is different from that of the first embodiment. In addition, the manner of supplying the TiCl$_4$ gas and the like are the same as those of the first embodiment. The processing conditions such as the pressures, the supply flow rates, the temperatures and the like at the time of supplying the respective gases may be the same as, for example, those of the first embodiment.

Figure 8:
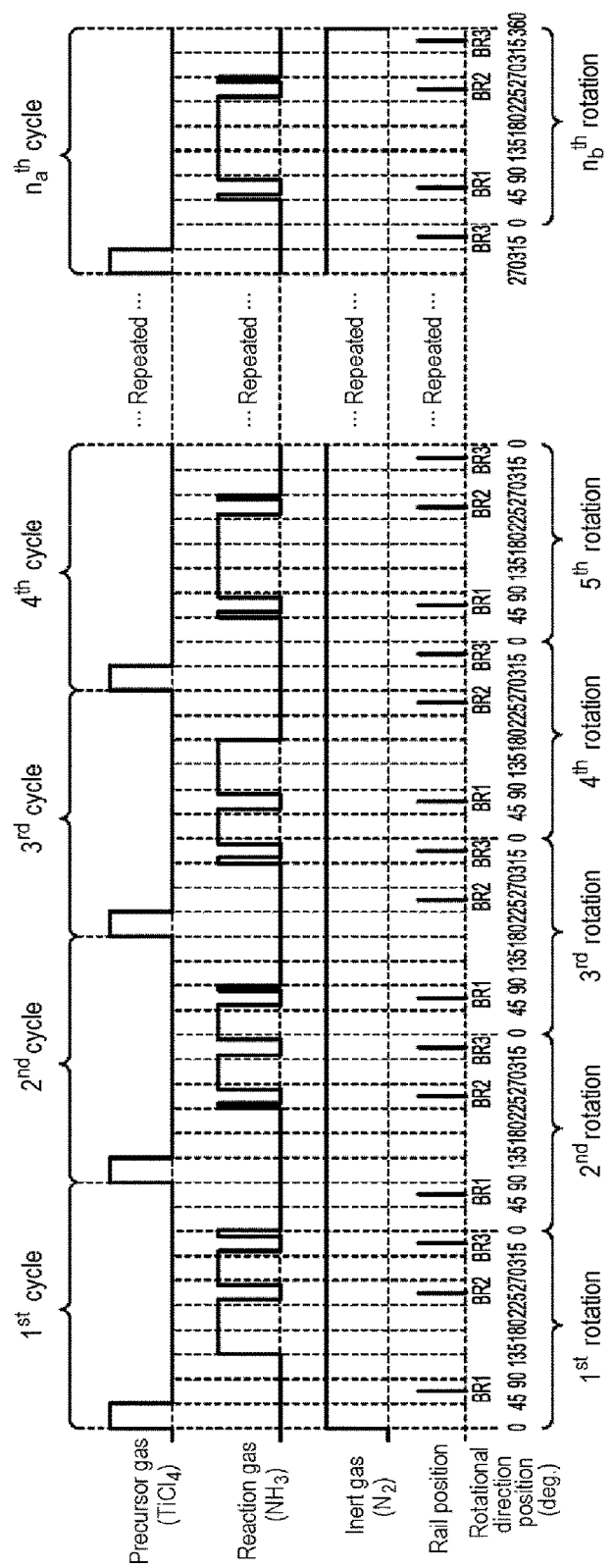
FIG. 8 is a timing chart showing the relationship between a process gas supply timing and a rotational direction position in a film forming process of a second embodiment.

As shown in FIG. 8, in the second embodiment, during the NH$_3$ gas supply period defined by the process gas supply sequence of each cycle, the supply amount of the NH$_3$ gas is reduced at a timing at which the rails BR1 to BR3 exist between the gas supply holes 420a and the wafers 200 (and in the vicinity of the timing), as compared with other timings (before and after the aforementioned timing) (the timings at which the rails BR1 to BR3 do not exist between the gas supply holes 420a and the wafers 200).

More specifically, at the timing at which the rails BR1 to BR3 exist between the gas supply holes 420a and the wafers 200 (and in the vicinity of the timing), the valve 324 is closed to stop the supply of the NH$_3$ gas from the gas supply holes 420a. In this way, the NH$_3$ gas is supplied to the wafers 200 at the timing selected so that the rails BR1 to BR3 do not exist between the gas supply holes 420a and the wafers 200.

Instead of closing the valve 324 and stopping the NH$_3$ gas supply at the timing at which the rails BR1 to BR3 exist between the gas supply holes 420a and the wafers 200 (and in the vicinity of the timing), the flow rate of the NH$_3$ gas may be reduced so as to reduce the influence by the collision of a gas flow with the rails BR1 to BR3 (specifically, so as to substantially eliminate the influence). Thus, it is possible to restrain the flow of the NH$_3$ gas from being inhibited by the rails BR1 to BR3. The case where the valve 324 is closed to stop the supply of the NH$_3$ gas may also be regarded as one mode of such gas flow rate reduction.

If a time lag occurs between the closing of the valve 324 and the actual stop of the supply of the NH$_3$ gas or between the adjustment of the flow rate of the NH$_3$ gas by the MFC 322 and the actual change of the flow rate of the NH$_3$ gas, the timing to close the valve 324 or the timing to adjust the flow rate by the MFC 322 may be adjusted in view of the time lag.

In the present embodiment, description has been made under the simplified assumption that the gas supply holes 410a and the gas supply holes 420a have the same rotational direction position. However, when the rotational direction position of the gas supply holes 420a is deviated from the rotational direction position of the gas supply holes 410a, the timing to close the valve 324 or the timing to adjust the flow rate by the MFC 322 may be adjusted in view of the timing corresponding to the deviation.

In the second embodiment, as in the first embodiment, the inhibition of the flow of the TiCl$_4$ gas by the rails BR1 to BR3 is suppressed, and the inhibition of the flow of the NH$_3$ gas by the rails BR1 to BR3 is suppressed. As a result, it is possible to further suppress the partial reduction in the deposition rate described above and to further improve the in-plane uniformity of film formation.

Third Embodiment of the Present Disclosure

In the first and second embodiments, there has been described an example where the TiCl$_4$ gas and the NH$_3$ gas are alternately supplied. In the third embodiment, an example where the TiCl$_4$ gas and the NH$_3$ gas are simultaneously supplied will be described.

Figure 9:
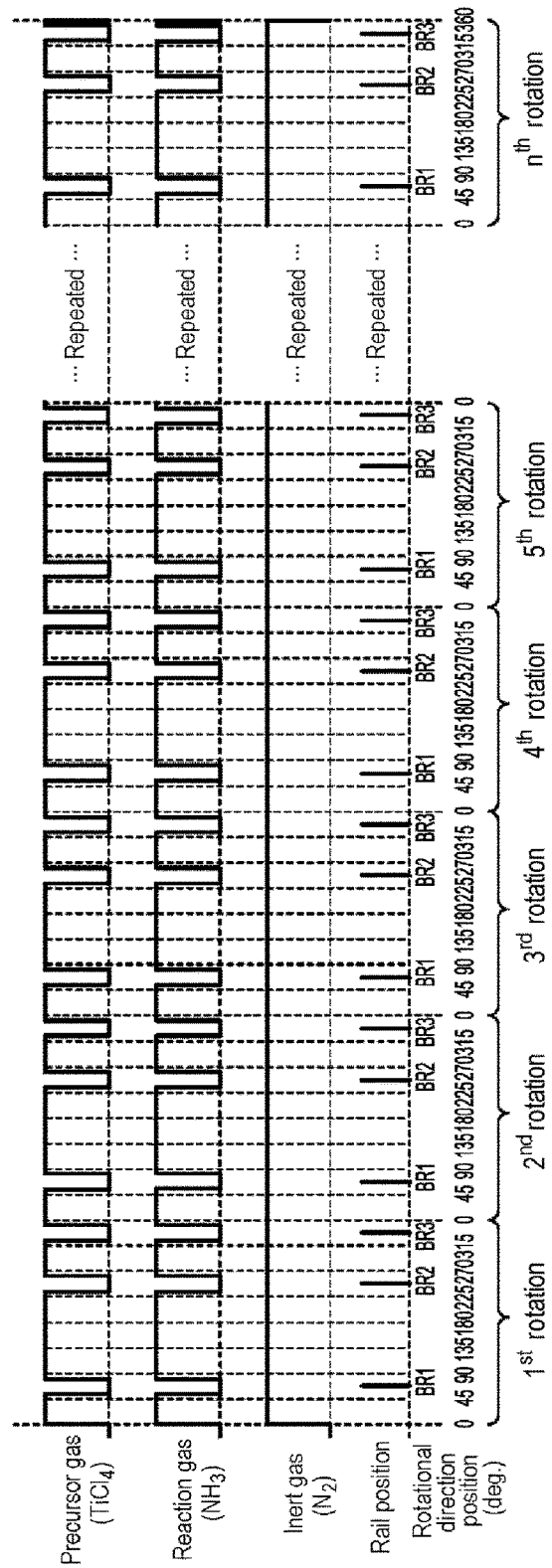
FIG. 9 is a timing chart showing the relationship between a process gas supply timing and a rotational direction position in a film forming process of a third embodiment.

As shown in FIG. 9, in the third embodiment, each of the TiCl$_4$ gas and the NH$_3$ gas is continuously supplied. Therefore, the timing at which the rails BR1 to BR3 exist between the gas supply holes 410a and the wafers 200 is included in the supply period of the TiCl$_4$ gas. The timing at which the rails BR1 to BR3 exist between the gas supply holes 420a and the wafers 200 is included in the supply period of the NH$_3$ gas.

In the third embodiment, as for the supply of the TiCl$_4$ gas, at the timing at which the rails BR1 to BR3 exist between the gas supply holes 410a and the wafers 200 (and in the vicinity of the timing), the supply amount of the TiCl$_4$ gas is reduced as compared with other timings (the timings at which the rails BR1 to BR3 do not exist between the gas supply holes 410a and the wafers 200). Similarly, as for the supply of the NH$_3$ gas, at the timing at which the rails BR1 to BR3 exist between the gas supply holes 420a and the wafers 200 (and in the vicinity of the timing), the supply amount of the NH$_3$ gas is reduced as compared with other timings (the timings at which the rails BR1 to BR3 do not exist between the gas supply holes 420a and the wafers 200). The method of reducing the supply amounts of the TiCl$_4$ gas and the NH$_3$ gas is the same as the method of reducing the supply amount applied to the supply of the NH$_3$ gas in the second embodiment.

For example, at the timing at which the rails BR1 to BR3 exist between the gas supply holes 410a and the wafers 200 (and in the vicinity of the timing), the valve 314 is closed to stop the supply of the TiCl$_4$ gas from the gas supply holes 410a. In such a case, the TiCl$_4$ gas is supplied to the wafers 200 at a timing selected so that the rails BR1 to BR3 do not exist between the gas supply holes 410a and the wafers 200. Furthermore, for example, at the timing at which the rails BR1 to BR3 exist between the gas supply holes 420a and the wafers 200 (and in the vicinity of the timing), the valve 324 is closed to stop the supply of the NH$_3$ gas from the gas supply holes 420a. In such a case, the NH$_3$ gas is supplied to the wafers 200 at a timing selected such that the rails BR1 to BR3 do not exist between the gas supply holes 420a and the wafers 200.

Instead of stopping the supply of the TiCl$_4$ gas from the gas supply holes 410a at the timing at which the rails BR1 to BR3 exist between the gas supply hole 410a and the wafers 200 (and in the vicinity of the timing), by reducing the flow rate of the TiCl$_4$ gas, the inhibition of the flow of the TiCl$_4$ gas by the rails BR1 to BR3 may be suppressed. Furthermore, instead of stopping the supply of the NH$_3$ gas from the gas supply holes 420a at the timing at which the rails BR1 to BR3 exist between the gas supply hole 420a and the wafers 200 (and in the vicinity of the timing), by reducing the flow rate of the NH$_3$ gas, the inhibition of the flow of the NH$_3$ gas by the rails BR1 to BR3 may be suppressed.

The processing conditions such as the pressures, the supply flow rates, the temperatures and the like at the time of supplying the TiCl$_4$ gas and the NH$_3$ gas may be the same as, for example, those of the first embodiment.

In the third embodiment, the inhibition of the flow of the TiCl$_4$ gas by the rails BR1 to BR3 is suppressed, and the inhibition of the flow of the NH$_3$ gas by the rails BR1 to BR3 is suppressed. As a result, it is possible to suppress the partial reduction in the deposition rate described above and to improve the in-plane uniformity of film formation.

By applying such reduction of the gas supply amount to at least one of the TiCl$_4$ gas and the NH$_3$ gas so as to suppress the inhibition of the flow of the process gas by the rails BR1 to BR3, it is possible to obtain the above-mentioned effects as compared with the case where simultaneous supply is performed without applying such reduction of the supply amount to any of the TiCl$_4$ gas and the NH$_3$ gas.

Fourth to Tenth Embodiments of the Present Disclosure

Figure 11:
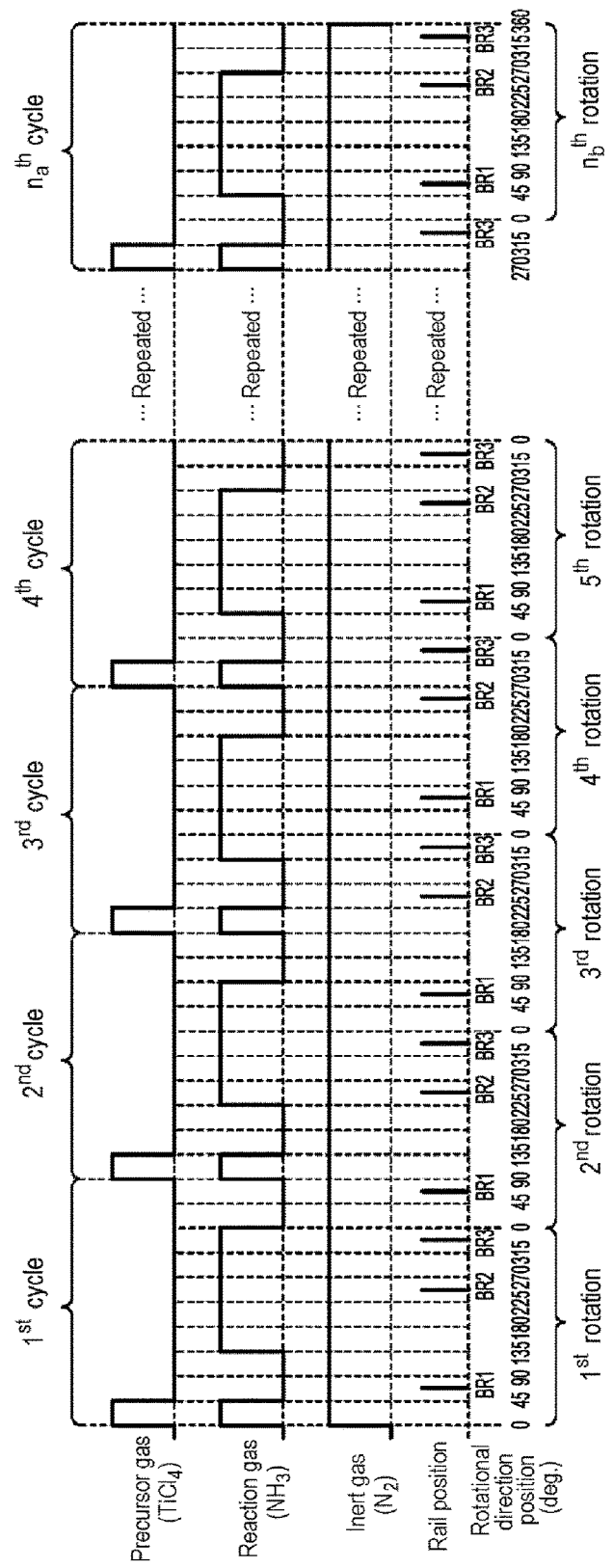
FIG. 11 is a timing chart showing the relationship between a process gas supply timing and a rotational direction position in a film forming process of a fourth embodiment.

Next, fourth to tenth embodiments will be described. FIG. 11 shows, as a fourth embodiment, an example in which a gas supply operation of supplying the NH$_3$ gas simultaneously with the supply of the TiCl$_4$ gas is added to the NH$_3$ gas supply sequence of the first embodiment.

Figure 12:
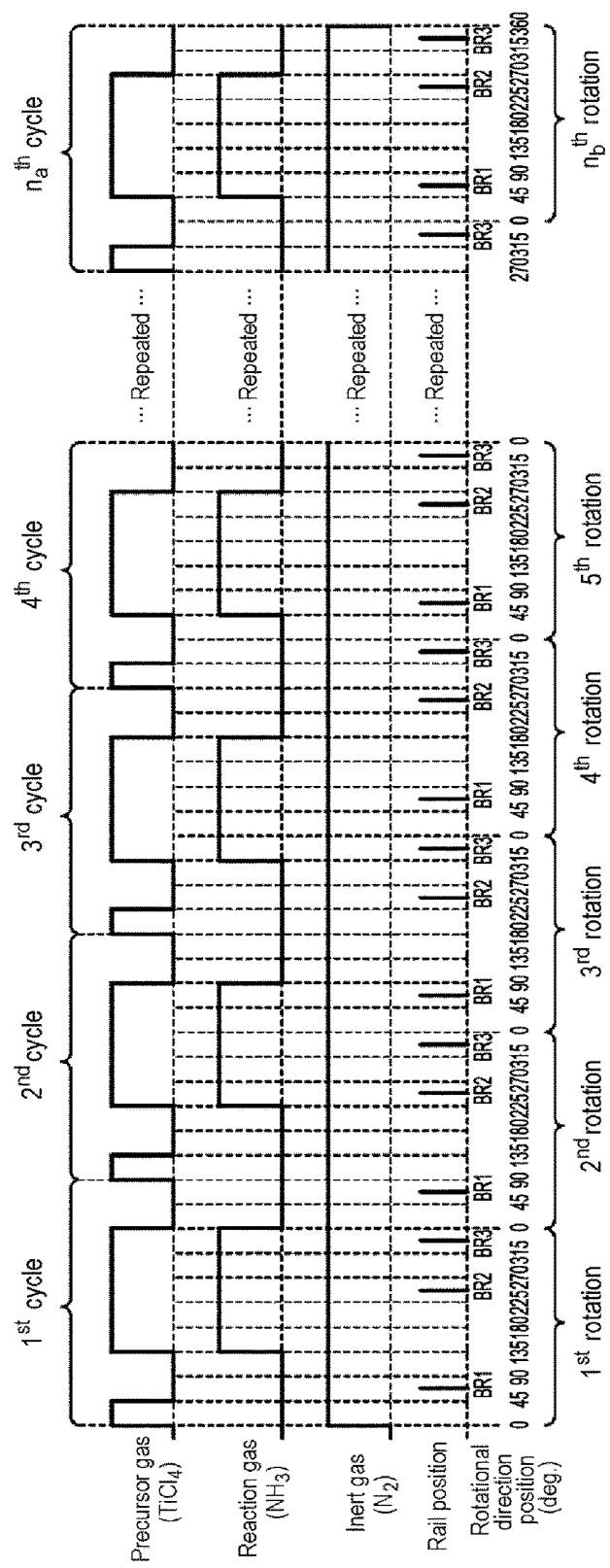
FIG. 12 is a timing chart showing the relationship between a process gas supply timing and a rotational direction position in a film forming process of a fifth embodiment.

FIG. 12 shows, as a fifth embodiment, an example in which a gas supply operation of supplying the TiCl$_4$ gas simultaneously with the supply of the NH$_3$ gas is added to the TiCl$_4$ gas supply sequence of the first embodiment.

Figure 13:
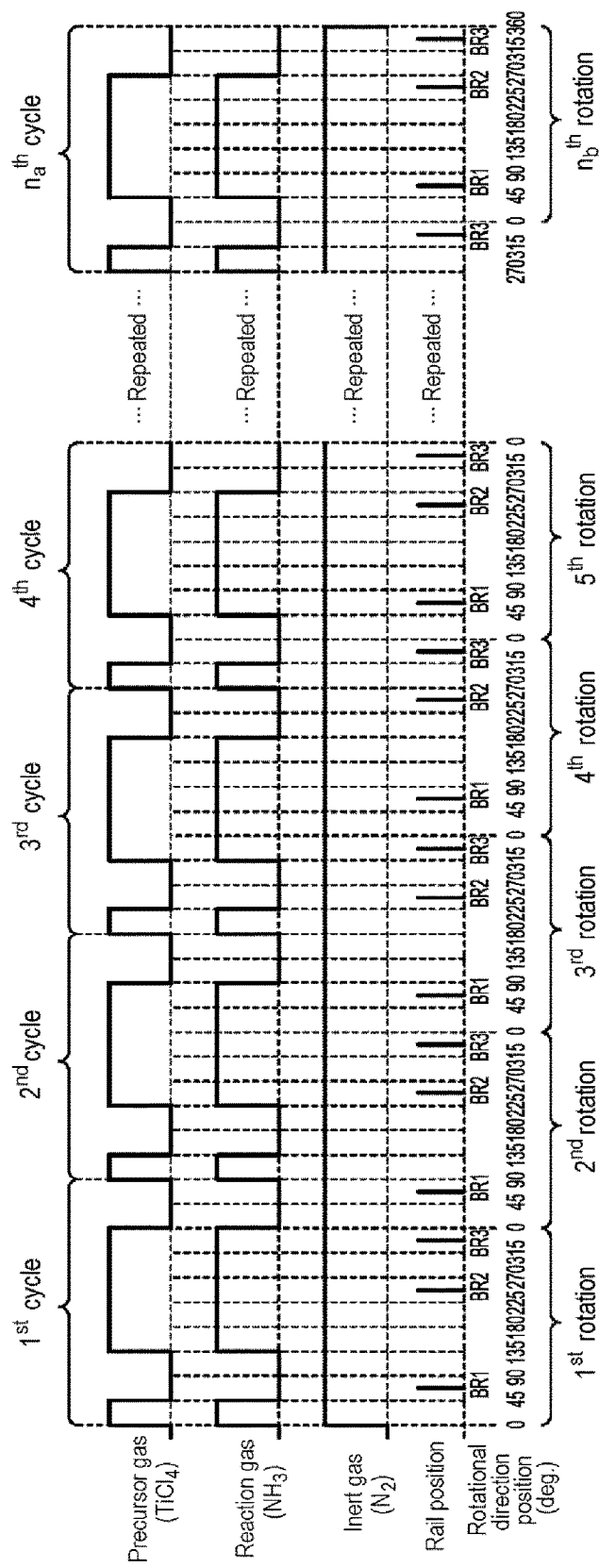
FIG. 13 is a timing chart showing the relationship between a process gas supply timing and a rotational direction position in a film forming process of a sixth embodiment.

FIG. 13 shows, as a sixth embodiment, an example in which a gas supply operation of supplying the NH$_3$ gas simultaneously with the supply of the TiCl$_4$ gas is added to the NH$_3$ gas supply sequence of the first embodiment, and a gas supply operation of supplying the TiCl$_4$ gas simultaneously with the supply of the NH$_3$ gas is added to the TiCl$_4$ gas supply sequence of the first embodiment.

Figure 14:
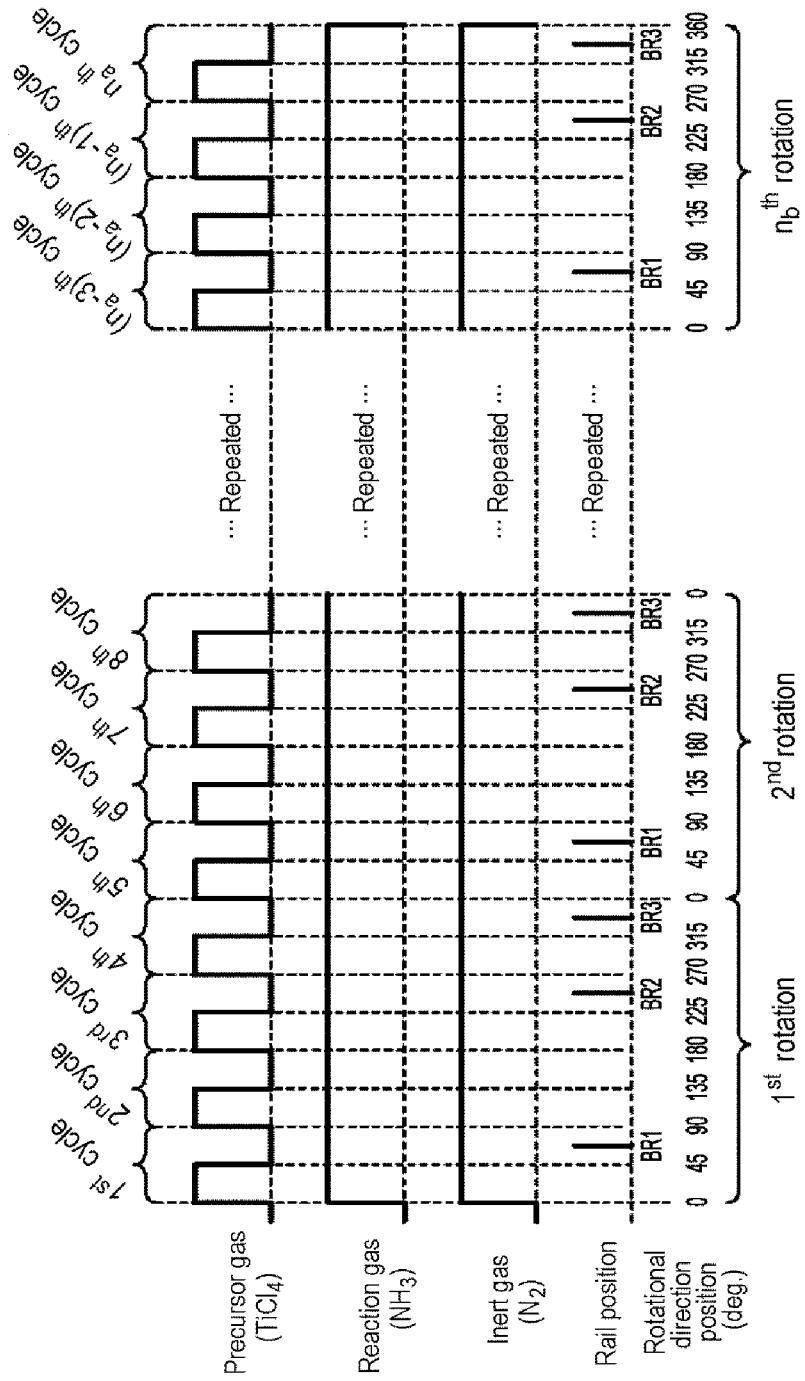
FIG. 14 is a timing chart showing the relationship between a process gas supply timing and a rotational direction position in a film forming process of a seventh embodiment.

FIG. 14 shows, as a seventh embodiment, an example in which one of the NH$_3$ gas and the TiCl$_4$ gas, for example, the NH$_3$ gas, is continuously supplied and the other of the NH$_3$ gas and the TiCl$_4$ gas, for example, the TiCl$_4$ gas, is intermittently supplied. The TiCl$_4$ gas is supplied so as to avoid collision with the rails BR1 to BR3 during any supply period.

Figure 15:
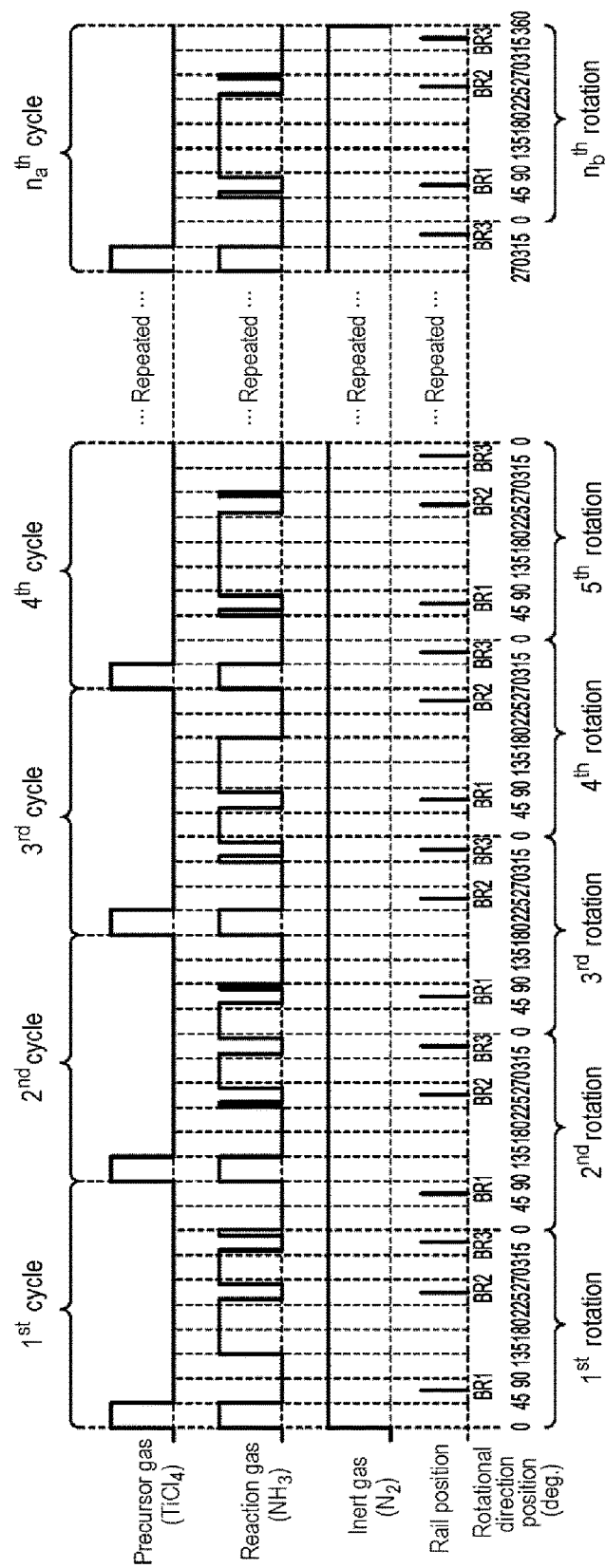
FIG. 15 is a timing chart showing the relationship between a process gas supply timing and a rotational direction position in a film forming process of an eighth embodiment.

FIG. 15 shows, as an eighth embodiment, an example in which a gas supply operation of supplying the NH$_3$ gas simultaneously with the supply of the TiCl$_4$ gas is added to the NH$_3$ gas supply sequence of the second embodiment.

Figure 16:
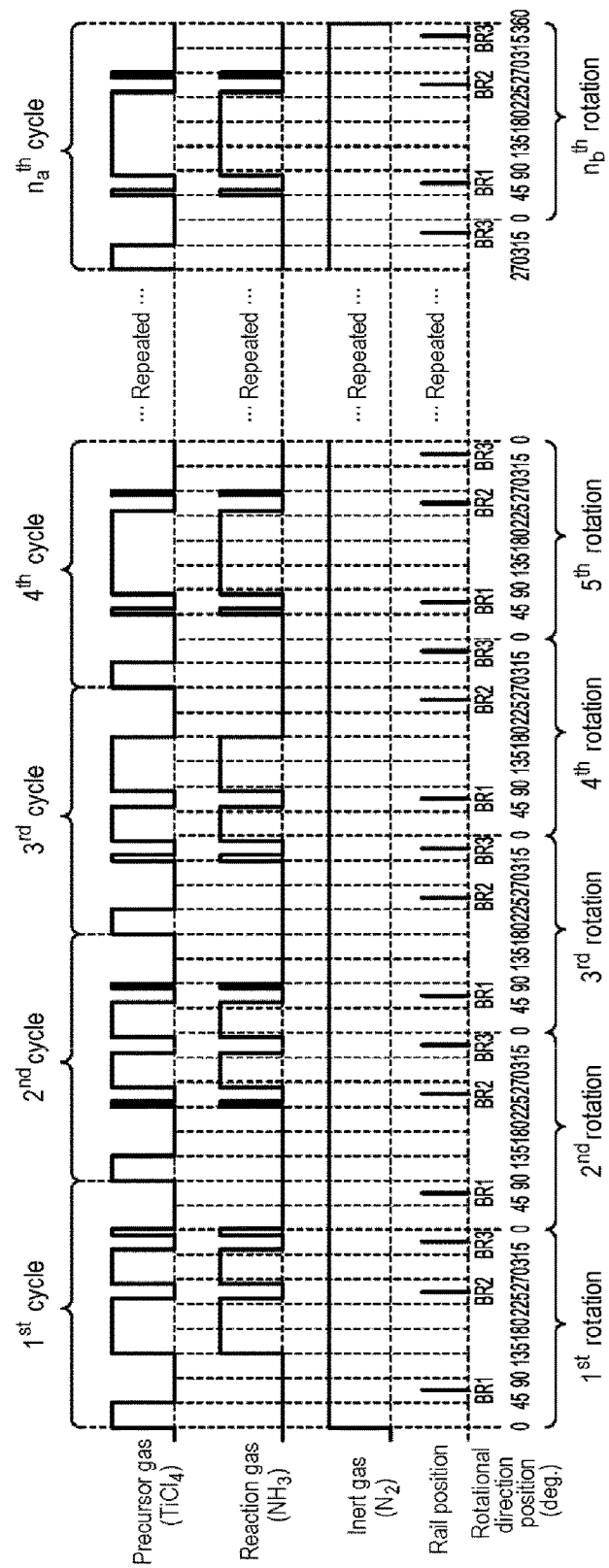
FIG. 16 is a timing chart showing the relationship between a process gas supply timing and a rotational direction position in a film forming process of a ninth embodiment.

FIG. 16 shows, as a ninth embodiment, an example in which a gas supply operation of supplying the TiCl$_4$ gas simultaneously with the supply of NH$_3$ gas is added to the TiCl$_4$ gas supply sequence of the second embodiment.

Figure 17:
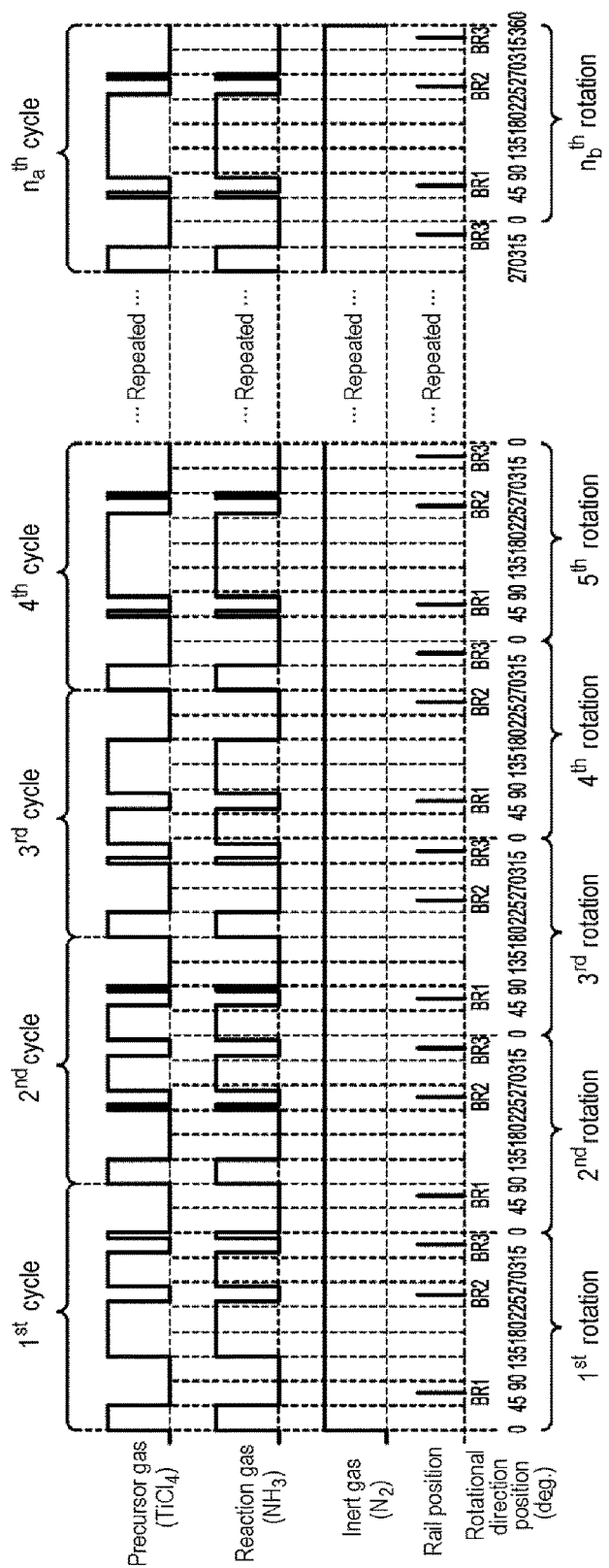
FIG. 17 is a timing chart showing the relationship between a process gas supply timing and a rotational direction position in a film forming process of a tenth embodiment.

FIG. 17 shows, as a tenth embodiment, an example in which a gas supply operation of supplying the NH$_3$ gas simultaneously with the supply of the TiCl$_4$ gas is added to the NH$_3$ gas supply sequence of the second embodiment, and a gas supply operation of supplying the TiCl$_4$ gas simultaneously with the supply of the NH$_3$ gas is added to the TiCl$_4$ gas supply sequence of the first embodiment.

In the fourth and seventh to tenth embodiments, the TiCl$_4$ gas is supplied so as to avoid collision with the rails BR1 to BR3 during any supply period, thereby assuring improvement in the in-plane uniformity of film formation. In the eighth to tenth embodiments, the NH$_3$ gas is supplied so as to avoid collision with the rails BR1 to BR3 during any supply period, thereby assuring improvement in the in-plane uniformity of film formation. In the fifth and sixth embodiments, there is provided a period during which the TiCl$_4$ gas or the NH$_3$ gas is supplied so as to avoid collision with the rails BR1 to BR3. Thus, as compared with the case where the collision with the rails BR1 to BR3 is not avoided at all times, it is possible to improve the in-plane uniformity of film formation.

In the fourth embodiment and the like, there is provided a period during which the TiCl$_4$ gas and the NH$_3$ gas are simultaneously supplied. In other words, there exists a period during which the TiCl$_4$ gas and the NH$_3$ gas are supplied at the same time. However, it is not indispensable to match the supply start timing of the TiCl$_4$ gas with the supply start timing of the NH$_3$ gas. In addition, it is not indispensable to match the supply stop timing of the TiCl$_4$ gas with the supply stop timing of the NH$_3$ gas.

Other Embodiments of the Present Disclosure

The respective embodiments described above may be used in combination as appropriate. Furthermore, the present disclosure is not limited to the above-described embodiments and may be diversely modified without departing from the spirit thereof.

In the embodiments described above, there has been described an example in which the film forming process is performed. However, the present disclosure is not limited only to the application to the film forming process but may be widely applied to film forming processes in which a process gas is supplied from the horizontal outer side of a substrate while rotating the substrate supported by rails. Since the inhibition of the flow of the process gas by the rails of a substrate support tool is suppressed, it is possible to improve the in-plane uniformity of the substrate processing performed using the process gas. In addition to the film forming process, the present disclosure may be applied to, for example, an etching process that performs etching by supplying a process gas. This makes it possible to enhance the in-plane uniformity of etching.

When applied to the film forming process, the present disclosure is not limited to a case where a conductive film such as, for example, a metal film or the like is formed as in the above-described embodiments, but may be applied to a case where a semiconductor film, an insulating film or the like is formed. Examples of applicable films include: a W film; a metal nitride-based film or a metal carbide-based film such as a WN film, a TaN film, a MoN film, a ZnN film, a WC film, a TiC film, a TaC film, a MoC film, a ZnC film, a WCN film, a TiCN film, a TaCN film, a MoCN film, a ZnCN film or the like; a metal film such as a Cu film, a Ru film, an Al film or the like; a high dielectric constant film such as a HfO film, a ZrO film, an AlO film, a HfSiO film, a ZrSiO film, an AlSiO film or the like; a combination of these films; a Si film; a SiN film; a SiO film; a SiCN film; a SiON film; a SiOC film; and a combination thereof.

There is no particular restriction on the process gas such as the precursor gas, the reaction gas or the like used for the film forming process. Examples of the precursor gas includes titanium tetrafluoride (TiF$_4$), tungsten hexafluoride (WCl$_6$), tungsten hexafluoride (WF$_6$), tantalum pentachloride (TaCl$_5$), tantalum pentafluoride (TaF$_5$), molybdenum hexachloride (MoCl$_6$), molybdenum hexafluoride (MoF$_6$), zinc dichloride (ZnCl$_2$), zinc difluoride (ZnF$_2$), copper dichloride (CuCl$_2$), copper difluoride (CuF$_2$), ruthenium trichloride (RuCl$_3$), ruthenium trifluoride (RuF$_3$), ruthenium tribromide (RuBr$_3$), aluminum trichloride (AlCl$_3$), aluminum trifluoride (AlF$_3$), trimethyl aluminum ((CH$_3$)$_3$Al, abbreviation: TMA), hafnium tetrachloride (HfCl$_4$), hafnium tetrafluoride (HfF$_4$), a tetrakis(ethylmethylamino)hafnium (Hf[N(C$_2$H$_5$)(CH$_3$)]$_4$, abbreviation: TEMAH) gas, a tetrakis(dimethylamino)hafnium (Hf[N(CH$_3$)$_2$]$_4$, abbreviation: TDMAH) gas, a tetrakis(diethylamino)hafnium (Hf[N(C$_2$H$_5$)$_2$]$_4$, abbreviation: TDEAH) gas, zirconium tetrachloride (ZrCl$_4$), zirconium tetrafluoride (ZrF$_4$), a tetrakis (ethylmethylamino)zirconium (Zr[N(C$_2$H$_5$)(CH$_3$)]$_4$, abbreviation: TEMAZ) gas, a tetrakis(dimethylamino)zirconium (Zr[N(CH$_3$)$_2$]$_4$, abbreviation: TDMAZ) gas, a tetrakis (diethylamino)zirconium (Zr[N(C$_2$H$_5$)$_2$]$_4$, abbreviation: TDEAZ) gas, a hexachlorodisilane (Si$_2$Cl$_6$, abbreviation: HCDS) gas, a tetrachlorosilane or silicon tetrachloride (SiCl$_4$, abbreviation: STC) gas, a trichlorosilane (SiHCl$_3$, abbreviation: TCS) gas, a dichlorosilane (SiH$_2$Cl$_2$, abbreviation: DCS) gas, a monochlorosilane (SiH$_3$Cl, abbreviation: MCS) gas, a monosilane (SiH$_4$) gas, a disilane (Si$_2$H$_6$) gas, a trisilane (Si$_3$H$_8$) gas, a tetrakis(dimethylamino)silane (Si[N(CH$_3$)$_2$]$_4$, abbreviation: 4DMAS) gas, a tris(dimethylamino)silane (Si[N(CH$_3$)$_2$]$_3$H, abbreviation: 3DMAS) gas, a bis(diethylamino)silane (Si[N(C$_2$H$_5$)$_2$]$_2$H$_2$, abbreviation: BDEAS) gas, a bis(tertiary butylamino)silane (SiH$_2$[NH(C$_4$H$_9$)]$_2$, abbreviation: BTBAS) gas, and the like.

In the above-described embodiments, there has been described an example in which when supplying the process gases including plural types of gases (specifically, the TiCl$_4$ gas and the NH$_3$ gas), these gases are supplied from the gas supply holes of different nozzles (specifically, the gas supply holes 410a and 420a of the nozzles 410 and 420). However, if necessary, it may be possible to adopt an embodiment in which the respective process gases including plural types of gases are supplied from a common nozzle.

In the above-described embodiments, there has been described an example in which the process gases including plural types of gases are supplied. However, if necessary, a process gas including only one kind of gas may be used.

In the above-described embodiments, there has been described an example in which a film is formed using a substrate processing apparatus which is a batch-type vertical apparatus for processing a plurality of substrates at a time, namely a processing furnace having a structure in which nozzles for supplying process gases are vertically installed in a reaction tube and in which an exhaust port is provided in the lower portion of the reaction tube. However, the present disclosure may also be applied to a case where a film is formed using a processing furnace having other structures. For example, the present disclosure may also be applied to a case where a film is formed using a processing furnace which includes two reaction tubes (an outer reaction tube referred to as an outer tube and an inner reaction tube referred to as an inner tube) having concentric cross sections and which has a structure in which a process gas is caused to flow from a nozzle vertically installed inside the inner tube toward an exhaust port opened in the side wall of the outer tube at a position (line symmetry position) facing the nozzle across substrates. In addition, the process gas may be supplied from a gas supply port opened in the side wall of the inner tube, instead of being supplied from the nozzle vertically installed inside the inner tube. At this time, the exhaust port opened in the outer tube may be opened so as to correspond to the height at which a plurality of substrates stacked and accommodated in a process chamber exists. Moreover, the shape of the exhaust port may be a hole shape or a slit shape.

Further, in the above-described embodiments, there has been described an example in which a thin film is formed using a substrate processing apparatus having a hot wall type processing furnace. However, the present disclosure is not limited thereto and may be suitably applied to a case where a thin film is formed using a substrate processing apparatus having a cold wall type processing furnace. Even in these cases, the processing conditions may be similar to, for example, the processing conditions of the above-described embodiments.

Even in the case of using these substrate processing apparatuses, film formation may be performed under the same sequence and processing conditions as those of the above-described embodiments.

The process recipes (the programs describing processing procedures, processing conditions and the like) may be used for forming these various types of thin films are individually prepared (in a plural number) according to the contents of the substrate processing (the film type, composition ratio, film quality, film thickness, processing procedure, processing condition, and the like of a thin film to be formed). When starting the substrate processing, it is possible to appropriately select a proper process recipe from a plurality of process recipes according to the contents of the substrate processing. Specifically, the process recipes individually prepared according to the contents of the substrate processing may be stored (installed) in advance in the memory device 121c of the substrate processing apparatus via an electric communication line or a recording medium (external memory device 123) which stores the process recipes. When starting the substrate processing, the CPU 121a of the substrate processing apparatus appropriately may select a proper process recipe from the process recipes stored in the memory device 121c according to the contents of the substrate processing. With such a configuration, it is possible to form thin films of different film types, composition ratios, film qualities and film thicknesses in a single substrate processing apparatus in a versatile and highly reproducible manner. In addition, it is possible to reduce operator's operation burden (input burden of processing procedures, processing conditions and the like) and to quickly start substrate processing while avoiding an operation error.

Further, the present disclosure may also be realized, for example, by changing a process recipe of an existing substrate processing apparatus. In the case of changing the process recipe, it is possible to install the process recipe according to the present disclosure in an existing substrate processing apparatus via an electric communication line or a recording medium which records the process recipe. It is also possible to operate an input/output device of an existing substrate processing apparatus, thereby changing the process recipe thereof to the process recipe according to the present disclosure.

The various embodiments described above may be used in appropriate combination. The processing conditions at this time can be similar to, for example, the processing conditions of the above-described embodiments.

Example

As an example, a film was formed by the process gas supply step (see FIG. 6A) similar to the example described in the first embodiment. In addition, as a comparative example, a film was formed by the process gas supply step (see FIG. 10A) similar to the example described in the aforementioned comparative embodiment.

Figure 18A:
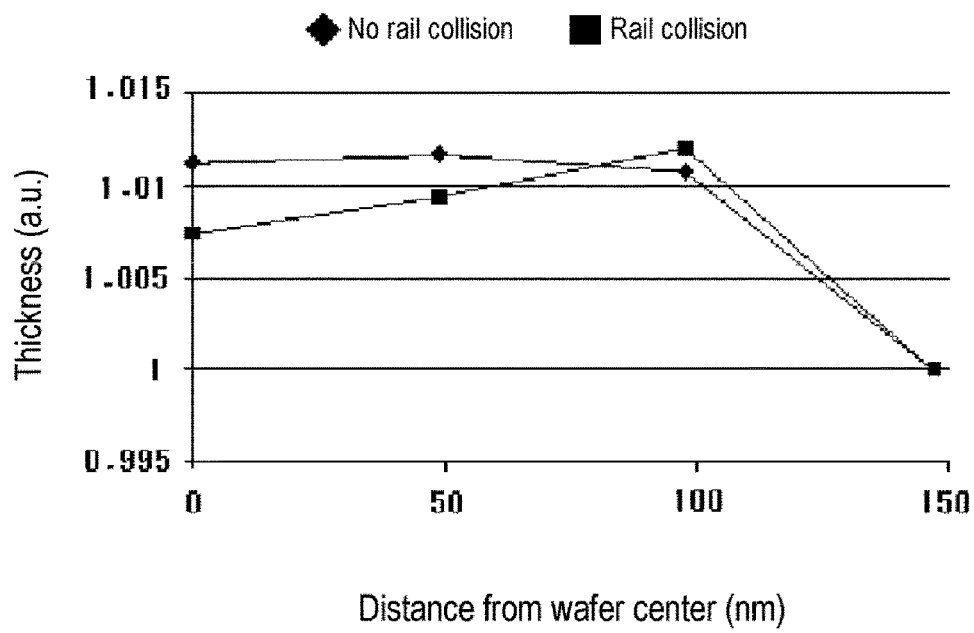
FIG. 18A is a graph showing the film thickness distribution in a wafer plane in an example and a comparative example.
Figure 18B:
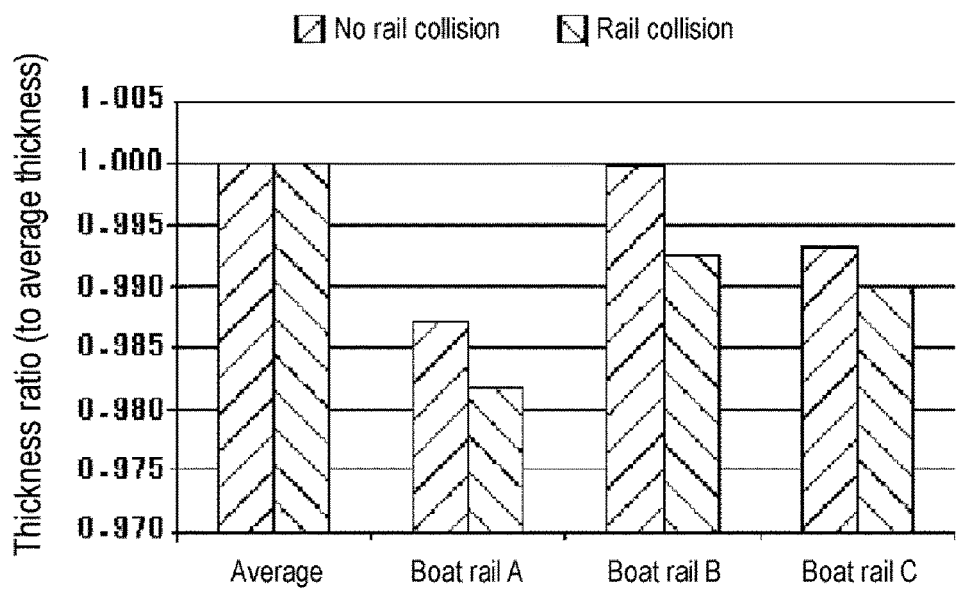
FIG. 18B is a graph showing the ratio of a film thickness around each boat rail to an average film thickness in a wafer plane in an example and a comparative example.

The results of the example and the comparative example will be described with reference to FIGS. 18A and 18B. FIG. 18A is a graph showing a film thickness distribution in a wafer plane. In FIG. 18A, the horizontal axis indicates the distance from the center of the wafer in a unit of mm, and the vertical axis indicates the film thickness in an arbitrary unit. FIG. 18B is a graph showing the ratio of the film thickness around each boat rail to the average film thickness in the wafer plane. In FIG. 18B, the horizontal axis indicates the average film thickness and the results obtained around the three boat rails A to C side by side, and the vertical axis indicates the film thickness ratio to the average film thickness. In FIGS. 18A and 18B, the example is expressed as "no rail collision" and the comparative example is expressed as "rail collision."

In the example, as compared with the comparative example, the film thickness in the central portion of the wafer can be increased, and the thinning of the film around the boat rails can be reduced. In this way, by suppressing the collision of the gas flow with the rails, it is possible to increase the deposition rate in the central portion of the wafer and the portions of the wafer around the boat rails. It is also possible to improve the in-plane uniformity of film formation.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    rotating a substrate support tool accommodated in a process chamber and configured to support a substrate with a rail;
    supplying a process gas including a first gas in a pulse-wise manner to the substrate from a first gas supply hole positioned outside the substrate in a horizontal direction while rotating the substrate support tool; and
    supplying an inert gas continuously to the substrate from an inert gas supply hole positioned outside the substrate in the horizontal direction while rotating the substrate support tool,
    wherein in the act of supplying the process gas in the pulse-wise manner, the first gas is not directly supplied to the substrate during at least one period within a pulse according to the pulse-wise manner, the rail being positioned between the first gas supply hole and the substrate during the at least one period such that the rail blocks the direct supply of the first gas to the substrate, and
    wherein the act of supplying the inert gas continuously includes supplying the inert gas when the rail is positioned between the inert gas supply hole and the substrate.

2. The method of claim 1, wherein in the act of rotating the substrate support tool, the substrate support tool supporting a plurality of substrates including the substrate with the rail is rotated, the plurality of substrates being stacked in a vertical direction, and
    in the act of supplying the process gas, the process gas is supplied via a nozzle extending in the vertical direction, the nozzle having a plurality of gas supply holes including the first gas supply hole.

3. The method of claim 1, wherein in the act of supplying the process gas, in addition to the first gas, a second gas as the process gas is supplied from a second gas supply hole positioned at an outer side of the substrate in the horizontal direction, and the first gas and the second gas are time-divisionally supplied a predetermined number of times.

4. The method of claim 3, wherein in the act of supplying the process gas, the second gas is supplied to the substrate in a second period in which the rail is not positioned between the second gas supply hole and the substrate.

5. The method of claim 3, wherein in the act of supplying the process gas, the first gas is supplied to the substrate in a first period in which the rail is not positioned between the first gas supply hole and the substrate, and the second gas is supplied to the substrate in a second period in which the rail is not positioned between the second gas supply hole and the substrate, in accordance with a relationship between a cycle time for time-divisionally supplying the first gas and the second gas and a rotation period of the substrate support tool.

6. The method of claim 3, wherein in the act of supplying the process gas, the second gas is supplied to the substrate in a second period in which the rail does not exist at a position where an angle formed by a gas flow of the second gas injected from the second gas supply hole and a peripheral edge of the substrate is a right angle.

7. The method of claim 1, wherein in the act of supplying the process gas, a supply of the first gas is stopped in a period in which the rail is positioned between the first gas supply hole and the substrate.

8. The method of claim 1, wherein the first gas is a metal-containing gas.

* * * * *